United States Patent
Furnémont

(10) Patent No.: US 7,933,153 B2
(45) Date of Patent: Apr. 26, 2011

(54) METHOD FOR EXTRACTING THE DISTRIBUTION OF CHARGE STORED IN A SEMICONDUCTOR DEVICE

(75) Inventor: Arnaud Furnémont, Philippeville (BE)

(73) Assignee: IMEC, Leuven (BE)

( * ) Notice: Subject to any disclaimer, the term of this patent is extended or adjusted under 35 U.S.C. 154(b) by 381 days.

(21) Appl. No.: 11/916,796

(22) PCT Filed: Jun. 6, 2006

(86) PCT No.: PCT/EP2006/062944
§ 371 (c)(1),
(2), (4) Date: Feb. 10, 2009

(87) PCT Pub. No.: WO2006/128922
PCT Pub. Date: Dec. 7, 2006

(65) Prior Publication Data
US 2009/0135652 A1    May 28, 2009

Related U.S. Application Data

(60) Provisional application No. 60/687,076, filed on Jun. 3, 2005, provisional application No. 60/704,859, filed on Aug. 1, 2005.

(30) Foreign Application Priority Data

Oct. 14, 2005 (EP) ..................... 05109600

(51) Int. Cl.
*G11C 11/34* (2006.01)
(52) U.S. Cl. ......... 365/185.18; 365/185.03; 365/185.19; 365/201; 365/185.28; 365/184
(58) Field of Classification Search ............. 365/185.03, 365/185.18, 185.19, 201, 185.28, 184
See application file for complete search history.

(56) References Cited

U.S. PATENT DOCUMENTS 5,583,811 A    12/1996 Van Houldt et al.
(Continued)

FOREIGN PATENT DOCUMENTS

WO    99/07000    2/1999

OTHER PUBLICATIONS

Rosmeulen et al., "Characterization of the spatial charge distribution in local charge-trapping memory devices using the charge-pumping technique," Solid State Electronics Journal, 48:1525-1530 (2004).
Chim et al., "Extraction of metal-oxide-semiconductor field-effect-transistor interface state and trapped charge spatial distributions using a physics-based algorithm," Journal Applied Physics, 81(4):1993-2001 (1997).

(Continued)

*Primary Examiner* — Huan Hoang
*Assistant Examiner* — Jay Radke
(74) *Attorney, Agent, or Firm* — McDonnell Boehnen Hulbert & Berghoff LLP

(57) ABSTRACT

The invention relates to a method for determining a set of programming conditions for a given type of charge-trapping non-volatile memory device, comprising the steps of: (a) selecting different sets of programming parameters to be applied to the corresponding number of non-volatile memory devices of said type, (b) programming said number of non-volatile memory devices by means of the sets of programming parameters, (c) determining an actual spatial charge distribution of the charge trapping layer of each of the programmed devices, (d) determining the influence of at least one of the programming parameters on the spatial charge distribution, (e) determining an optimised value for at least one of the programming parameters, (f) entering each optimized value in said sets of programming parameters and repeating steps b) to e) at least once.

21 Claims, 23 Drawing Sheets

U.S. PATENT DOCUMENTS

| | | |
|---|---|---|
| 6,331,953 B1 | 12/2001 | Wang |
| 6,396,741 B1 | 5/2002 | Bloom et al. |
| 6,490,204 B2 | 12/2002 | Bloom et al. |
| 6,768,165 B1 | 7/2004 | Eitan |
| 7,508,718 B2 | 3/2009 | Furnemont |
| 2001/0048614 A1* | 12/2001 | Bloom et al. ............ 365/185.22 |
| 2003/0002345 A1 | 1/2003 | Avni et al. |
| 2004/0027871 A1 | 2/2004 | Bloom et al. |
| 2004/0222437 A1 | 11/2004 | Avni et al. |
| 2005/0105333 A1 | 5/2005 | Park et al. |
| 2005/0237815 A1 | 10/2005 | Lue et al. |
| 2006/0050553 A1 | 3/2006 | Yeh |
| 2009/0141563 A1 | 6/2009 | Furnemont |

OTHER PUBLICATIONS

European Search Report for EP05109600 dated Apr. 16, 2006.
Sun et al., "Effects of CHE and CHISEL Programming Operation on the Characteristics of SONOS Memory", Solid-State and Integrated Circuits Technology, 7th International Conference on Beijing, China, IEEE, pp. 695-698 Oct. 18-21, 2004.
Gu et al., "Investigation of Programmed Charge Lateral Spread in a Two-Bit Storage Nitride Flash Memory Cell by Using a Charge Pumping Technique", IEEE, 42nd Annual International Reliability Physics Symposium, Phoenix, AZ, Apr. 25-29, 2004, pp. 639 (2004).
European Search Report for Application No. EP 05 10 9602 dated May 15, 2006.

* cited by examiner

METHOD FOR EXTRACTING THE DISTRIBUTION OF CHARGE STORED IN A SEMICONDUCTOR DEVICE

CROSS-REFERENCE TO RELATED APPLICATIONS

This application is a U.S. National Phase of International Application No. PCT/EP2006/062944, filed on Jun. 6, 2006, which claims priority to: (1) EP 05109600.6 filed on Oct. 14, 2005; (2) U.S. 60/687,076 filed on Jun. 3, 2005; and (3) U.S. 60/704,859 filed on Aug. 1, 2005.

TECHNICAL FIELD

The present invention relates to a method for determining a set of programming conditions for a given type of a non-volatile memory device comprising a charge-trapping layer of multiple discrete charge storage sites isolated from each other. The invention further relates to methods for operating non-volatile memory devices.

BACKGROUND ART

Non-volatile memories (NVM) are characterized by the fact that once a bit is stored in a memory cell this bit will be retained even when the memory cell is no longer powered. When electrical fields are used for erasing and programming of the memory cell, the NVM devices are also known as EEPROM (Electrically-Erasable-and-Programmable-Read-Only-Memory) devices. Whereas in floating gate EEPROM devices charge is stored in a conductive layer being part of a stacked double-capacitor structure, in charge-trapping EEPROM devices charge is stored in a non-conductive layer being part of a single-capacitor structure. In such non-conductive charge-storage layer, e.g. nitride, oxide containing polysilicon nanocrystals or metal nanoparticles, the charge will not spread out uniformly over the whole of the charge-storage layer but will be confined substantially to the location where the charge was introduced into this non-conductive charge-storage layer. Charge-trapping memory devices are characterized by the presence of discrete charge traps as memory elements contrary to floating gate memory devices where a conductive layer is used as one continuous charge trap for storing charge. Developments in EEPROM devices are increasingly focused on localized charge trapping because it eases integration and reduces stress-induced-leakage. In particular NROM™ devices using nitride as non-conductive charge-storage layer as disclosed for example by B. Eitan in U.S. Pat. No. 6,768,165, are very attractive since they allow storage of two physical bits per memory cell, each bit at a different location in the nitride charge-storage layer. By injecting carriers, e.g. electrons, in the nitride layer the NROM™ cell is programmed. In order to erase the NROM™ cell opposite-type carriers are injected in the nitride layer as to compensate the charge stored during programming, e.g. holes are injected in the nitride layer to compensate the electrons already present.

One method to determine the lateral distribution of charge in MOSFET-type devices is the technique known as Charge-Pumping (CP). This method was initially developed to study hot-carrier-induced degradation mechanisms in MOSFET-type devices. Charge-pumping measurements are a powerful technique for obtaining information on the charge trapped in a MOSFET-type device by scanning the threshold voltage along the channel of the device. M. Rosmeulen et al teaches in "Characterization of the spatial charge distribution in local charge-trapping memory devices using the charge-pumping technique", (Solid-State Electronics journal, volume 48 (2004) p 1525-1530), the application of the charge-pumping technique to non-volatile memory devices which are based on localized trapping of charge, in particular to n-type NROM™ devices using nitride or silicon-rich-oxide as trapping medium and injection of electrons for programming the memory cell. In particular section 3.3 of this disclosure, hereby incorporated by reference in its entirety, teaches how the lateral distribution of the total charge trapped in the device can be directly calculated from the charge-pumping measurements using a deconvolution-based procedure.

On the other hand Chim et al. describe in "Extraction of metal-oxide-semiconductor field-effect-transistor interface state and trapped charge spatial distributions using a physics-based algorithm" (Journal Applied Physics, volume 81(4) (1997), p 1993-2001) a charge extraction algorithm based on charge-pumping measurement data to gain insight in the hot-carrier-induced degradation mechanisms of MOSFETs and to extract both interface traps $N_{it}$ and oxide charge $N_{ot}$. This technique is based on an iteration scheme starting from values of interface traps, local threshold voltages etc, which are estimated in view of the expected results.

In charge-trapping EEPROM devices which allow storage of two physical bits per memory cell, special conditions have to be applied to the device in order to be able to read out the bits separately. More particularly, a screening voltage has to be applied to screen off the other, not-to-be-read, bit. This screening voltage may lead to unintentional programming of the bit which is being read out. There is thus a need to be able to reduce this screening voltage. On the other hand, there is always a need in the field of microelectronics to be able to scale the devices, which brings the two bits closer to each other. More in general, there is thus a need to be able to control the spatial distribution of the charge which is stored in the charge trapping layer.

DISCLOSURE OF THE INVENTION

It is an aim of the present invention to provide a method for determining a set of programming conditions for a given type of a charge-trapping non-volatile memory device which set is optimised towards a desired spatial charge distribution in the charge-trapping layer.

This aim is achieved according to the invention with a method showing the steps of the first claim.

According to the invention, a suitable set of programming conditions in view of a desired spatial charge distribution is determined as follows. First, different sets of programming parameters are selected for application to the junction regions, the bulk and the gate region of a number of non-volatile memory devices of the type under consideration. A number of these non-volatile memory devices are programmed by means of the sets of programming parameters, and an actual spatial charge distribution of the charge trapping layer of each of these devices is determined. Next, the influence of at least one of the programming parameters on the spatial charge distribution is determined by comparison of the previously determined actual spatial charge distributions, while taking into account the programming parameters initially selected. From these comparisons and the deducted influence of one or more parameters, an optimised value for at least one of the programming parameters is determined in view of the desired spatial charge distribution. This optimised value is then entered in place of the initial value of the parameter in the set, and the process is repeated at least once.

In this way, each of the programming parameters can be optimised towards the desired spatial charge distribution upon programming the charge-trapping device of the considered type. As a result, one can set a predetermined spatial charge distribution which is desired once the device is in use, and then obtain suitable programming conditions to ensure that the device in use is programmed according to this predetermined spatial charge distribution. In this way, problems resulting from the spatial charge distribution in use can be taken into account in advance or, in other words, unsuitable or undesirable spatial charge distributions in use can be avoided as one now has control over the way in which charge becomes stored in the charge-trapping layer.

The programming conditions/parameters comprise voltages to be applied to the different regions of the device, but may also comprise other parameters such as for example temperature conditions, etc.

In a preferred embodiment, the method of the invention comprises the initial step of determining said desired spatial charge distribution in function of a reduced maximal screening voltage to be applied to either of the junction regions for screening off the respective bit in the vicinity of the junction region where the screening voltage is applied. In this way, the spatial charge distribution can be controlled such that the screening voltage remains below values at which undesired programming of the bit which is read may occur. If other memory devices are connected to the junction at which the lowered screening voltage is applied, then undesired programming of these other memory devices is also avoided. In this embodiment, the desired spatial charge distribution is preferably determined by selecting the maximal screening voltage below a value at which accidental storage of charge in the charge trapping layer can occur; subsequently determining the width (Wb) of an extension region of one of the junction regions upon applying the maximal screening voltage to said junction region; and finally defining the desired spatial charge distribution such that, under the programming conditions to be determined, at least 90% of the charge stored in the vicinity of said junction region is within a distance (X1) smaller than or equal to said width (Wb) from said junction region.

In another preferred embodiment, the method of the invention comprises the initial step of determining said desired spatial charge distribution in function of a reduced channel length of said channel region. In this way, the spatial charge distribution can be optimised in view of the size of the device, so that downscaling becomes available. In this embodiment, the desired spatial charge distribution is preferably determined by selecting the channel length and defining a bit area for each bit in said charge-trapping layer and a margin in between said bit areas; and subsequently defining the desired spatial charge distribution such that, under the programming conditions to be determined, at least 90% of the charge stored in the vicinity of either of said junction regions is within the respective bit area. For example, the channel length can be selected below or equal to 90 nm and the margin can be set up to 20%, preferably at 1 to 20% of the channel length.

In a preferred embodiment, the actual spatial charge distributions of the various programmed devices of the considered type are determined by a charge pumping technique, comprising the following steps. Two charge pumping curves are determined, one by using a varying base-level voltage measurement and the other by using a varying top-level voltage measurement in the charge-pumping technique. More particularly, the first curve is determined by a first charge-pumping measurement on the semiconductor device whereby only the upper level of the charge-pump pulse is varied and the second curve is determined by a second charge-pumping measurement on the semiconductor device whereby only the lower level of the charge-pump pulse is varied. The data from the first and second charge-pumping measurements is combined to obtain the spatial distribution of the charge in the charge-trapping layer.

This combining of the data from the curves is done as follows. A relation is established between a charge pumping current $I_{cp}$ and a calculated channel length $L_{calc}$ of the semiconductor device by reconstructing a spatial charge distribution estimate from the charge pumping curves for multiple values of the maximum charge pumping current $I_{cp}$. These values are preferably chosen in the upper range of the charge pumping curves, more preferably as close as possible to where one assumes the maximum charge pumping current $I_{cp\_max}$ to be, but this is not essential. From the multiple values of $I_{cp}$, that value is selected for which the corresponding calculated channel length $L_{calc}$ is substantially equal to the effective channel length $L_{eff}$ of the semiconductor device. Finally, the actual spatial charge distribution is reconstructed from the charge pumping curves using this value of $I_{cp}$.

The above described method for determining the actual spatial charge distributions has the advantage that not only the spatial charge distribution of charge stored the charge-trapping layer can be extracted, but also the spatial charge distribution of charge stored in interface traps. In this way, the spatial distribution of both electrons and holes in the dielectric layer can be obtained. The thus obtained hole and electron distribution profiles can be used for physical understanding and optimisation of the programming and erase conditions. However, the actual spatial charge distributions may also be determined in any other way known to the person skilled in the art.

In a preferred embodiment, the combining of data from the charge pumping curves comprises the following steps. First, one value as charge pumping current $I_{cp}$ is selected on one of the charge pumping profiles. Next, the calculated channel length $L_{calc}$ corresponding to the selected charge pumping current $I_{cp}$ is determined by reconstructing a spatial charge distribution estimate for this charge pumping current $I_{cp}$. Then, the calculated channel length $L_{calc}$ is compared with the effective length $L_{eff}$. In case of a mismatch, a new value for the charge pumping current $I_{cp}$ is determined, using the mismatch as information to improve the choice. These steps are repeated until the mismatch substantially becomes zero. Further aspects and advantages from this method for determining the actual spatial charge distributions will appear from the detailed description given below.

It is further an aim of the invention to provide a method for operating a dual-bit non-volatile memory device, such that bits can be read out at a reduced screening voltage. This aim is achieved by means of the method of claim 8.

It is further an aim of the invention to provide a method for operating a dual-bit non-volatile memory device, such that interference between the bits in the same charge-storage layer can be avoided. This aim is achieved by means of the method of claim 10.

Since it is a matter of convention whether either programming or erasing involves injection of positive or negative charge carriers, i.e. electrons or holes, the wording "charge carriers of a first/second type" is used. The first type can be electrons and the second type can be holes, or vice versa.

In case the first type carriers are electrons, it is preferred that the predetermined programming conditions are chosen such that secondary electron injection is suppressed. It has been found that this is a convenient way to obtain the requirement that the resulting spatial charge distribution is such that a reduced screening voltage can be used or that interference between the bits can be avoided. The suppression of secondary electron injection can for example be achieved by means of a predetermined voltage difference between one of the junction regions and the bulk of the non-volatile memory device.

In another aspect, the invention relates to a memory circuit in which the above described technology is applied. Such a memory circuit comprises a matrix of charge-trapping memory devices, each device comprising a charge-trapping layer of multiple discrete charge storage sites isolated from each other, a channel region which extends underneath the charge-trapping layer in a bulk between two junction regions and a gate region which extends above the charge-trapping layer, the circuit further comprising peripheral circuitry for applying programming and erase conditions to each of the charge trapping memory devices, which in turn comprises means for forward biasing one junction region of each of the memory devices upon applying the programming conditions.

BRIEF DESCRIPTION OF THE DRAWINGS

The invention will be further elucidated by means of the following description and the appended figures.

MODES FOR CARRYING OUT THE INVENTION

Figure 1:
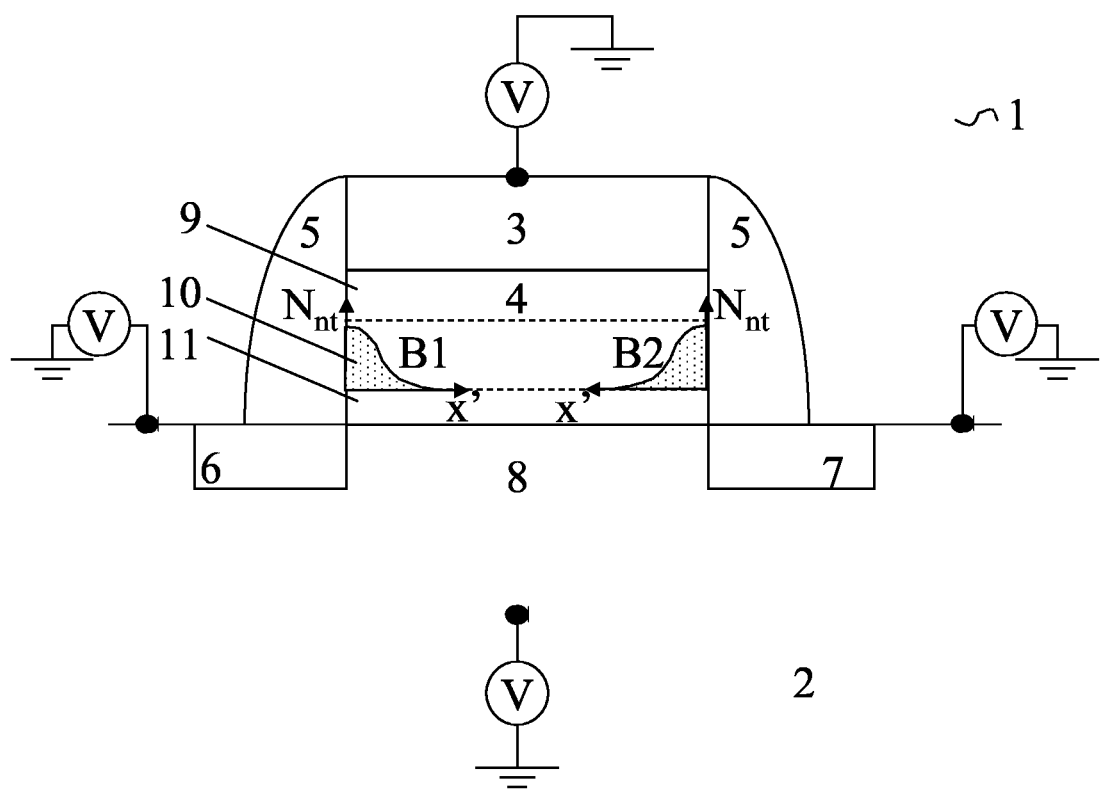
FIG. 1 shows a cross-section of a memory cell illustrating the storage of two bits in a single memory cell.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the invention.

Furthermore, the terms first, second, third and the like in the description and in the claims, are used for distinguishing between similar elements and not necessarily for describing a sequential or chronological order. The terms are interchangeable under appropriate circumstances and the embodiments of the invention can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the invention described herein can operate in other orientations than described or illustrated herein. For example "underneath" and "above" an element indicates being located at opposite sides of this element.

The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

For the purpose of teaching the invention an n-type memory cell is used wherein electrons are stored during programming. However the invention is not limited thereto.

FIG. 1 shows a cross-section of a memory cell 1 according to an embodiment of the invention illustrating the possibility of storing two bits B1, B2 in the charge storage layer 10 of a memory cell. The memory cell comprises a gate electrode 3 separated from the channel 8 by a dielectric layer (9, 10, 11) stack 4. Typically the gate electrode 3 is formed from a semiconductor material such as polycrystalline silicon doped to obtain the desired work function and/or conductivity. This semiconductor material can be partially or fully silicided as known in the art or even metals, e.g. Al, TiN, TaN, are used. The dielectric stack 4 comprises a charge storage layer 10 wherein charge can be stored at discrete storage sites. This dielectric charge storage layer 10 can be a layer of silicon-nitride, silicon-rich oxide, silicon-oxynitride, high-k dielectric such as alumina-oxide, hafnium-oxide, hafnium-silicon-oxide, an oxide layer comprising nanocrystals of a semiconductor material, e.g. polycrystalline silicon, or any other charge-trapping layer known to the person skilled in the art. Optionally this charge storage layer can be separated from the substrate 2 by another dielectric layer(s) 11 with low or no trapping capabilities, e.g. silicon-oxide. Another dielectric layer 9, preferably in a similar material as layer 11, can be used to separate the charge storage layer 10 from the gate electrode 3. The substrate 2 is a semiconductor substrate, e.g. silicon, silicon-on-insulator (SOI), germanium-on-insulator (GOI). Adjacent to the stack of gate electrode 3 and gate dielectric 4 sidewall spacers 5 formed in a dielectric material such as silicon-oxide, silicon-oxynitride, silicon-carbide, can be present. Aligned to this stack source 6 and drain regions 7 are formed in the substrate 2. These junctions (source 6, drain 7) are formed at lateral opposite sides of the channel 8. The source 6 and drain regions 7 are of a conductivity type opposite to the conductivity type of the substrate 2. The source 6 and drain regions 7 typically extend under the spacers 5 such that the channel region 8 is contacted. This channel region 8 is under dielectric control of the gate electrode 3. The device of FIG. 1 can be manufactured using processing steps and materials known to any person skilled in the art of manufacturing semiconductor devices, in particular non-volatile memory devices.

For the purpose of teaching the invention it is assumed that the device 1 is an nMOS device comprising a polysilicon gate electrode 3, which is n-type doped. Also source 6 and drain 7 regions are n-type doped while the substrate 2 is p-type doped. Sidewall spacers 5 formed in silicon-oxide are present. The gate dielectric 4 consists of a nitride layer used as charge-trapping layer 10 sandwiched between two layers (9, 11) of silicon-oxide. However the invention is not limited to this example. It will be appreciated that there are numerous variations and modifications possible. The device can be a PMOS device comprising device comprising a polysilicon gate electrode 3, which is p-type doped. Also source 6 and drain 7 regions are then p-type doped while the substrate 2 is n-type doped. Instead of being a stacked gate device as shown in FIG. 1 the device can be a split gate device such as the HIMOS memory cell disclosed in U.S. Pat. No. 5,583,811 hereby incorporated by reference in its entirety. Accordingly, the description should not be deemed to be limiting in scope.

In the programmed memory device 1 shown in FIG. 1, two bits B1 and B2 are stored at extreme locations of the charge storage layer 10, in the vicinity of the junction regions 6, 7. B1 is programmed by applying a voltage difference between source 6 and drain 7, with the drain being at lowest voltage. Likewise B2 is programmed by applying a voltage difference between drain 7 and source 6, with the source being at the lowest voltage. Appropriate voltages are applied to gate electrode 3 and the bulk 2. The threshold voltage of the channel at the position of a bit, B1 or B2, depends on the status of the corresponding bit. Each programmed bit is characterized by its charge distribution profile; i.e. charge concentration $N_{nt}$ as function of the position X' along the channel length. This charge distribution profile is preferably determined using the extraction method which will be described below, but may also be determined by means of other extraction techniques.

The smaller the lateral extension of each bit B1, B2 the shorter the channel length can be and the smaller the memory cell 1 can be. Hence a dense memory matrix 100 can be obtained.

The threshold voltage of the left part of the channel 8 overlapped by the charge distribution of B1 will be determined by the amount of charge stored in the corresponding region of the storage layer 10. If B1 is programmed, i.e. by convention defined as charge being stored in the corresponding location of the charge storage layer 10, then a high threshold voltage is obtained. If B1 is not programmed a low threshold voltage is obtained. In case of a programmed bit a higher gate voltage is needed to generate the same number of free electrons in the overlapped channel region compared to the unprogrammed situation. For a given biasing of the memory cell 1 less current will flow between drain 7 and source 6 if the memory cell is programmed. If two bits, B1 B2, can be stored at different locations in the same memory cell, it is desirable that these bits B1, B2 can be read out independent of each-other. If the status of B1 is checked by determining the corresponding current flow in the memory cell 1, the other bit B2 should be screened such that its status does not impact the current flow when reading out bit B1. This way of reading out a bit is known as reverse read. U.S. Pat. No. 6,768,165, hereby incorporated by reference, teaches reverse read out of a memory device wherein charge is stored in a charge storage layer.

Figure 2:
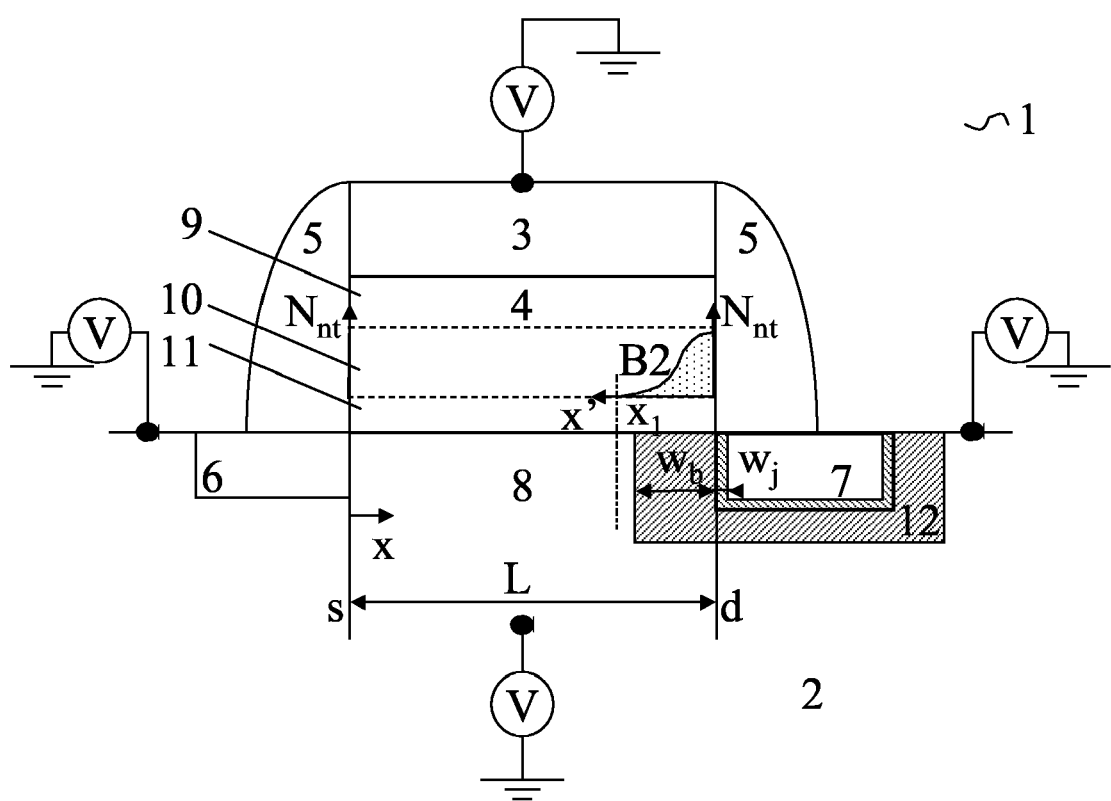
FIG. 2 shows a cross-section of a memory cell illustrating an embodiment of the invention.
Figure 3:
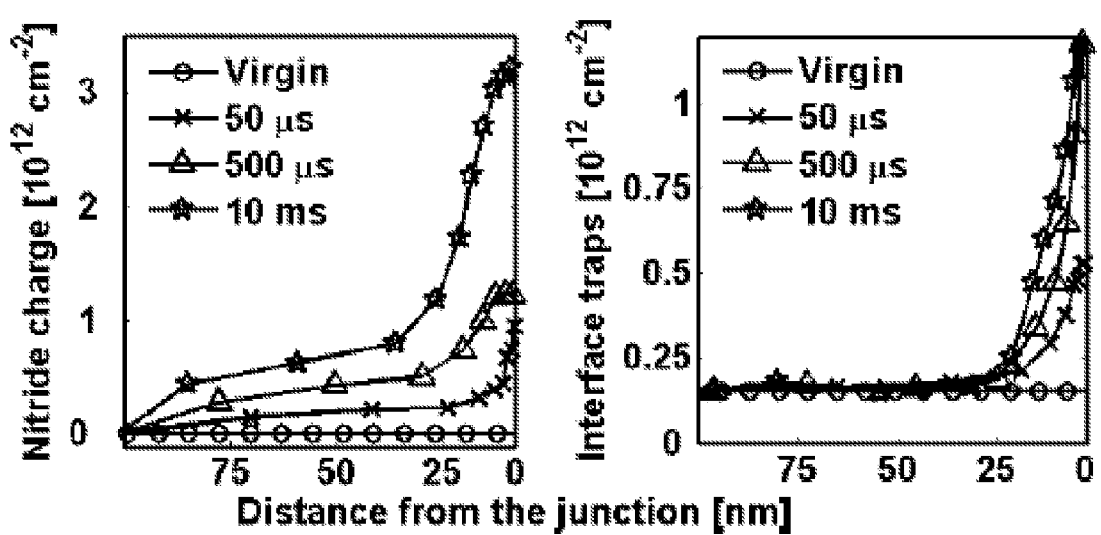
FIG. 3 to 6 show correlation between charge distribution (concentration as function of distance $X_1$ to junction) versus programming conditions illustrating embodiments of the invention.
Figure 4:
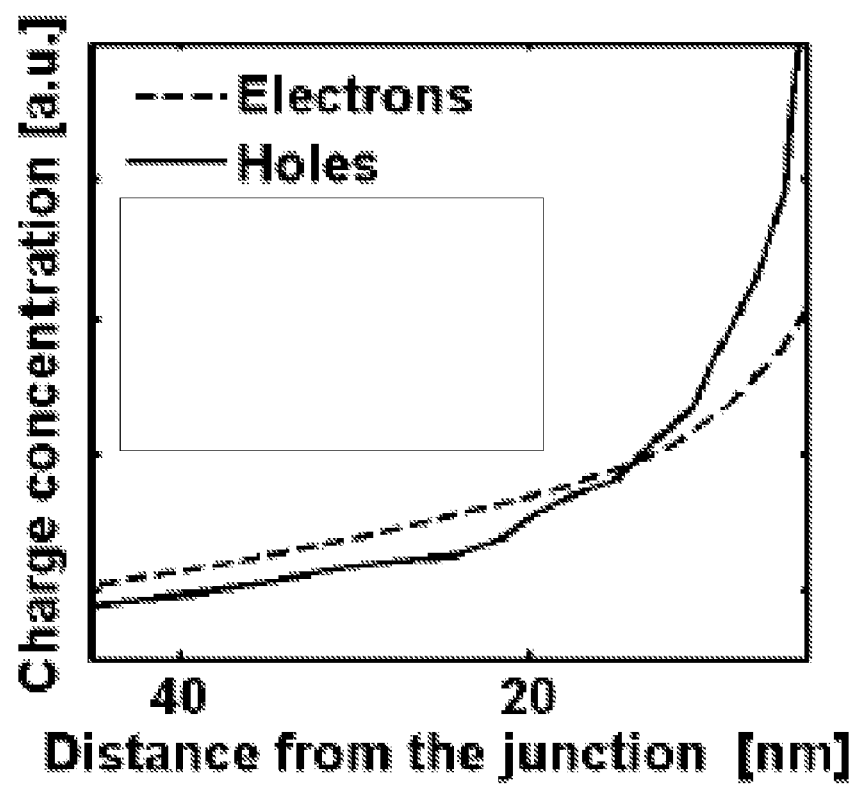
Figure 5A:
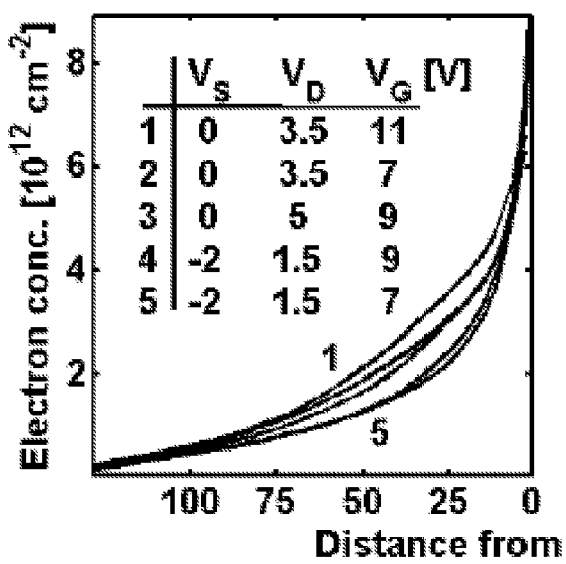
Figure 5B:
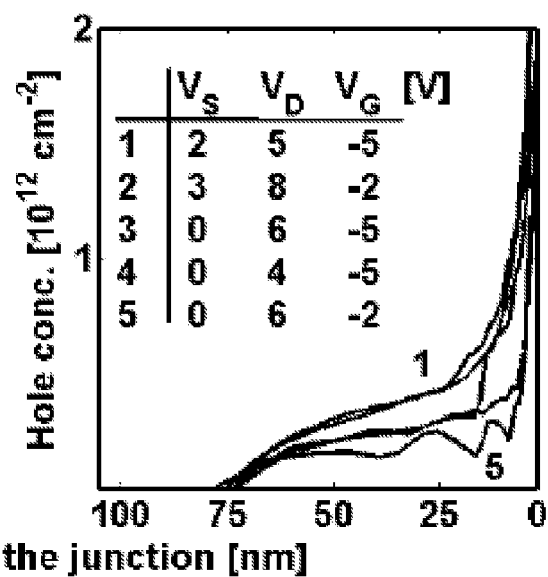
Figure 6A:
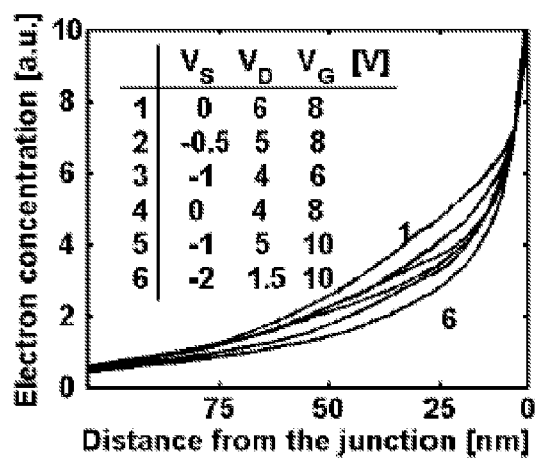
Figure 6B:
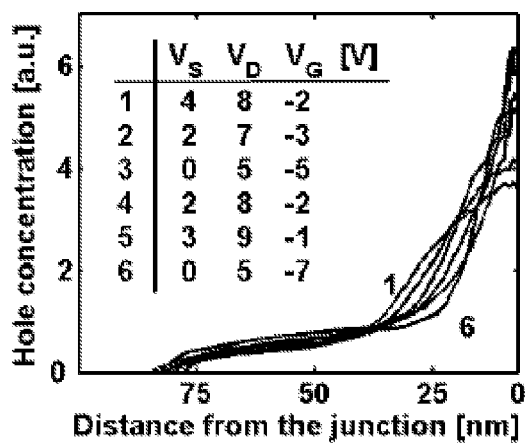

The memory device 1 of FIG. 1 is shown in FIG. 2 when reading out the bit B1 at the source side. In the embodiment illustrated by FIG. 2 bit B1 is not programmed, i.e. essentially no charge is present in the charge storage layer 10 at the source 6 side thereof. If one wants to determine the status of the bit at the position near the source 6, a voltage difference is applied between drain 7 and the source 6, with the drain being at the highest voltage. The remote drain 7-channel 8 junction is thus reverse biased, i.e. positive drain voltage for an n-type junction 7 in a p-type bulk 2, and a space charge region 12 is created. This space charge region 12 will partly extend $W_j$ into the junction 7, but a major part of it will extend towards $W_b$ the channel 8 as the channel 8 is the lowest doped part of the junction 7-8. In a space charge region free carriers are expelled from the dopants such that only a fixed charge remains. Hence the charge in the bit location B2 corresponding with the space charge region 12 can no longer influence the number of free carriers in the underlying corresponding channel 8 region. The bit B2 does not control the current flow between the source 6 and drain 7 and this current flow will be primarily determined by the program status of bit B1. Screening of a bit by creating a space charge region is thus a way of allowing independent read-out of bits B1, B2 stored in the same charge storage layer 10, be it at different locations. The larger the lateral charge distribution $X_1$ of programmed bit B2, the more the space charge region should extend Wb into the channel 8, such that this charge distribution is screened off by the space charge region: $X_1 = <Wb$.

This shows that if the lateral charge distribution $X_1$ can be controlled or changed, this will have an impact on the extension $W_b$ of the space charge region 12 between junction and channel which is needed for screening. More particularly, if the lateral charge distribution $X_1$ can be kept within predetermined limits, the extension $W_b$ and thus the screening voltage can be reduced. This in turn can prevent undesired accidental programming of the bit B1. Furthermore, if the lateral charge distribution $X_1$ can be reduced, scaling of the device becomes an option since the two bits B1, B2 can be allowed to be closer to each other without risking interference.

The extension $W_b$ is function inter alia of: dopant concentration of the junction as a technology-dependent parameters, dopant concentration channel as another technology-dependent parameters, voltage $V_d$ applied over the junction, i.e. voltage difference between the channel 8-junction 7, of the memory cell 101 which is being read. These technology-dependent parameters can thus be selected in view of the extension $W_b$ to be achieved.

The spread $X_1$ is function inter alia of the electrical field distribution in region from which charge is injected into the charge storage layer 10 during programming, e.g. channel 8 near drain junction 7, and the technology-dependent parameters: properties of the charge storage layer such as layer thickness, diffusion of the stored charge in and from this charge storage layer, and technology-dependent parameters which impact on compactness, density and distribution of charge storage sites. The electric field distribution in the memory device during operation is function of: the voltages applied to source 6, drain 7, bulk 2 and gate electrode 3 of the memory cell, dopant concentration in channel 8/bulk 2 such as profile junction. This junction profile can be gradual varying or being characterized by a steep variation in dopant concentration from channel towards bulk as appreciated by a person skilled in the art. These technology-dependent parameters and the operation conditions can thus be selected in view of the spread $X_1$ to be achieved.

Figure 7:
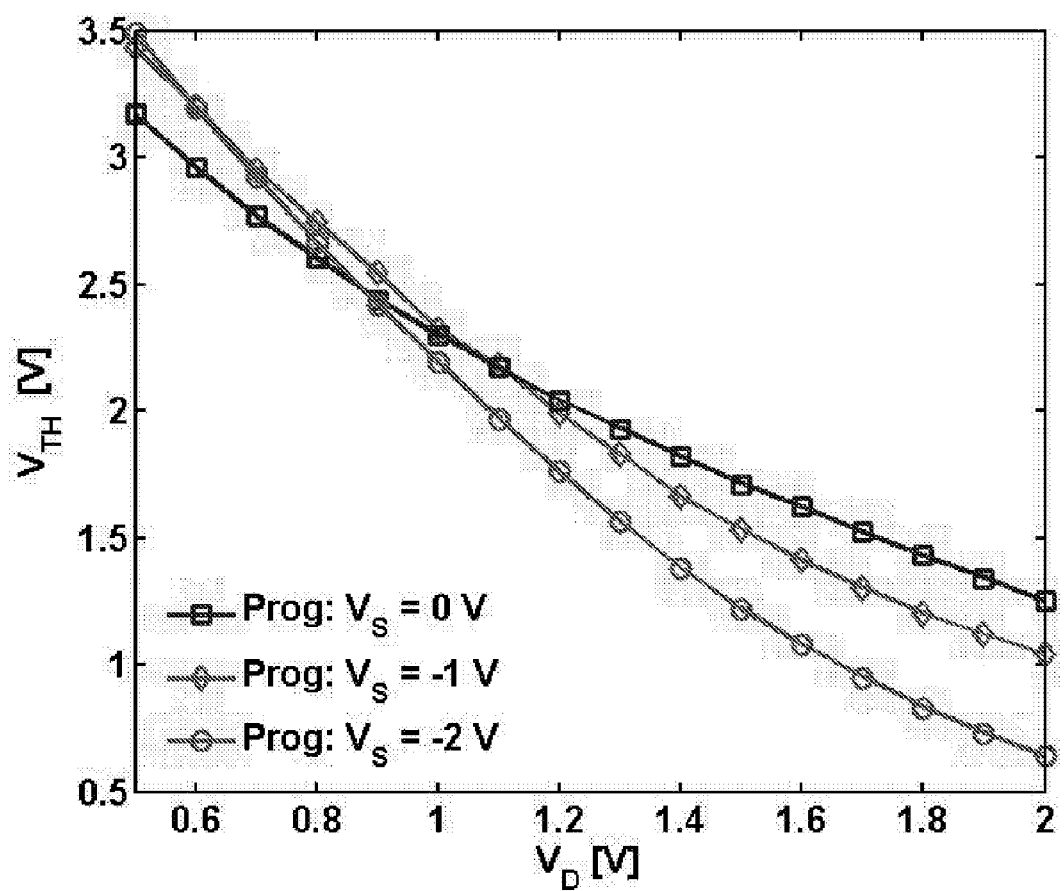
FIG. 7 shows threshold voltage of a memory cell as function of the voltage applied when reading the memory cell illustrating an embodiment of the invention.

FIG. 7 shows read-out of a dual-bit programmed memory cell 1, with B1 being unprogrammed and B2 being programmed. This memory cell is illustrated by the cross-section of FIG. 2.

The memory cell is programmed using different voltages at the source 6 side: e.g. 0V, −1V, −2V. The threshold voltage $V_{th}$ is defined as the gate voltage $V_g$ needed to reach a pre-determined current level in the memory cell. Typically 100 microamperes is used as pre-determined current level.

When reading the bit B1 adjacent the source 6, the voltage $V_d$ of the drain 7 is increased while measuring the corresponding current between source 6 and drain 7. For low drain voltages the charge of the programmed bit B2 near the drain is not or not completely screened by the space charge region extension $W_b$ of the drain junction. The current will be low and the threshold voltage $V_{th}$ will be high (e.g. above 3V). If the drain voltage increases more of the programmed bit B2 will be screened such that the impact of the corresponding charge on the current is reduced. More current will flow and a lower threshold voltage $V_{th}$ is measured. If the charge of bit B2 is completely screened, i.e. $X1<W_b$, the threshold voltage of an unprogrammed memory cell is measured (e.g. below 1.5V) as only the channel region corresponding to the location of the unprogrammed bit B1 is not depleted and essentially only the status of bit B1 is being detected. Depending on the voltage conditions when programming bit B2 a different charge distribution profile is obtained as illustrated by the difference in slope between the curves shown in FIG. 7. The more negative the source voltage for given bulk, drain and gate voltage bias, the sharper the charge distribution of bit B2. The sharper the spatial distribution $X_1$ of the programmed bit B2, the less drain voltage is needed to screen this charge. This is shown in FIG. 7 where for a programming voltage $V_s=-2V$, a sharper charge distribution profile is obtained resulting in a steeper threshold voltage $V_{th}$ for versus drain voltage $V_d$ curve. For the same drain voltage and hence the same space charge region width $W_b$ a larger amount of the stored charge can be screened if the charge profiled is steeper.

Figure 8:
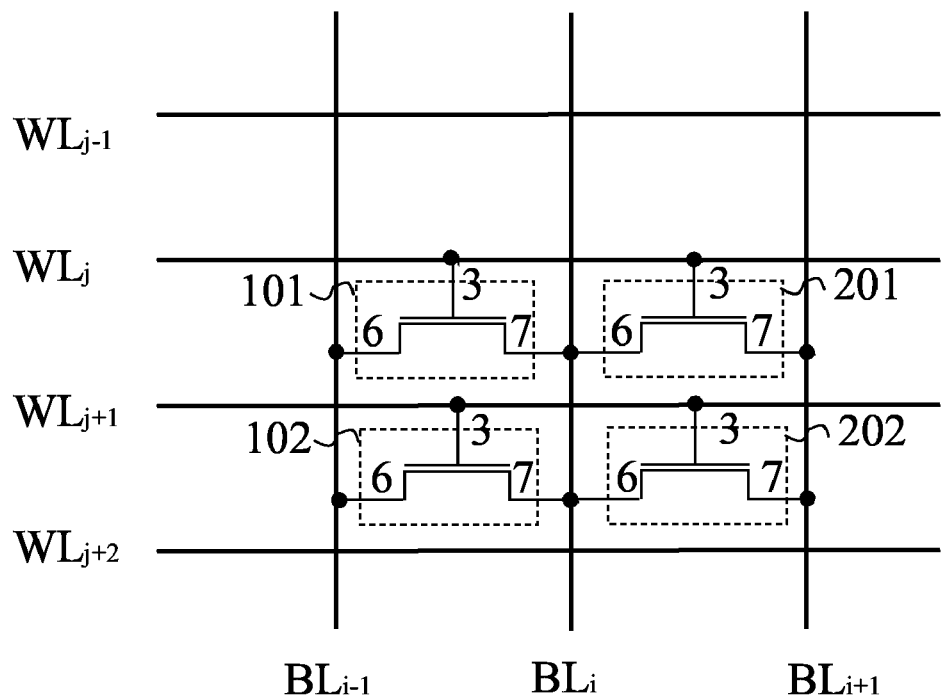
FIG. 8 shows a NAND-type memory architecture illustrating an embodiment of the invention.

FIG. 8 shows a memory matrix 100 in which memory cells 101, 102 are arranged in columns and rows. Memory cells in the same row share the word line $WL_j$, while memory cells 101, 102 in the same column share the bit lines BLi and BLi−1. If a voltage is applied to bit line BLi, this voltage is also applied to the junctions 7 of the memory cells 101, 102 and to the junctions 6 of the memory cells 201, 202 sharing this bit line BLi. When reverse reading the memory cell 101 to determine the bit status of the bit B1 near the source junction 6 the drain voltage should be limited to prevent additional programming of bit B2 as charge could be injected at the position of the second bit B1 adjacent to the drain junction 7. This reading voltage at the drain junction 7 should also be limited to avoid programming of bits at drain junction of memory cells 102 in the same column and bits at the source junction of memory cells 201 and 202 sharing the same bit line. The voltage Vd can also be limited by the voltage allowable for the non-addressed memory cells 102, 201, 202 sharing the same bit lines BLi. Such non-addressed memory cells 102, 201 and 202 will be electrically connected to the memory device in read-out, in particular to the junction to which the read-out voltage is applied, and hence will be subject to the some voltage at the connected junction (102:7, 201:6, 202:6). Hence the maximal screening voltage can also be selected below a value at which accidental storage of charge in the charge trapping layer of memory device being read is reduced but also accidental storage of charge in the charge trapping layer of memory devices electrically connected to the memory device in read-out might occur.

In the following the extraction method will be described by which the spatial charge distribution in the charge-trapping layer of the memory cell is preferably determined, upon determining a suitable set of programming conditions.

In general, all methods for extracting the spatial distribution of charge $N_{nt}$ stored in the charge-trapping layer (10) of the semiconductor device (1) which are discussed below comprise the following steps: determining a varying base-level voltage $V_{base}$ charge pumping curve, determining a varying top-level voltage $V_{top}$ charge pumping curve, and combining data from the charge pumping curves to obtain the spatial distribution of the stored charge $N_{nt}$. This combination of data is done by establishing a relation between a charge pumping current $I_{cp}$ and a calculated channel length $L_{calc}$ of the semiconductor device by reconstructing a spatial charge distribution from the charge pumping curves for multiple values of the charge pumping current $I_{cp}$. From these multiple values of $I_{cp}$ the value is obtained for which the corresponding calculated channel length $L_{calc}$ is substantially equal to the effective channel length $L_{eff}$ of the semiconductor device, this charge pumping current $I_{cp}$ being the maximum charge pumping current $I_{cp\_max}$. Finally the spatial distribution $N_{nt}$ of the charge is extracted by reconstructing the spatial charge distribution from the charge pumping curves using the value of $I_{cp}=I_{cp\_max}$.

In all embodiments described below, separately the spatial distribution of charges within a charge-trapping layer of a charge-trapping device and traps situated at the interface of this layer is extracted. Preferably this charge-trapping device is a non-volatile charge-trapping memory device.

Figure 9A:
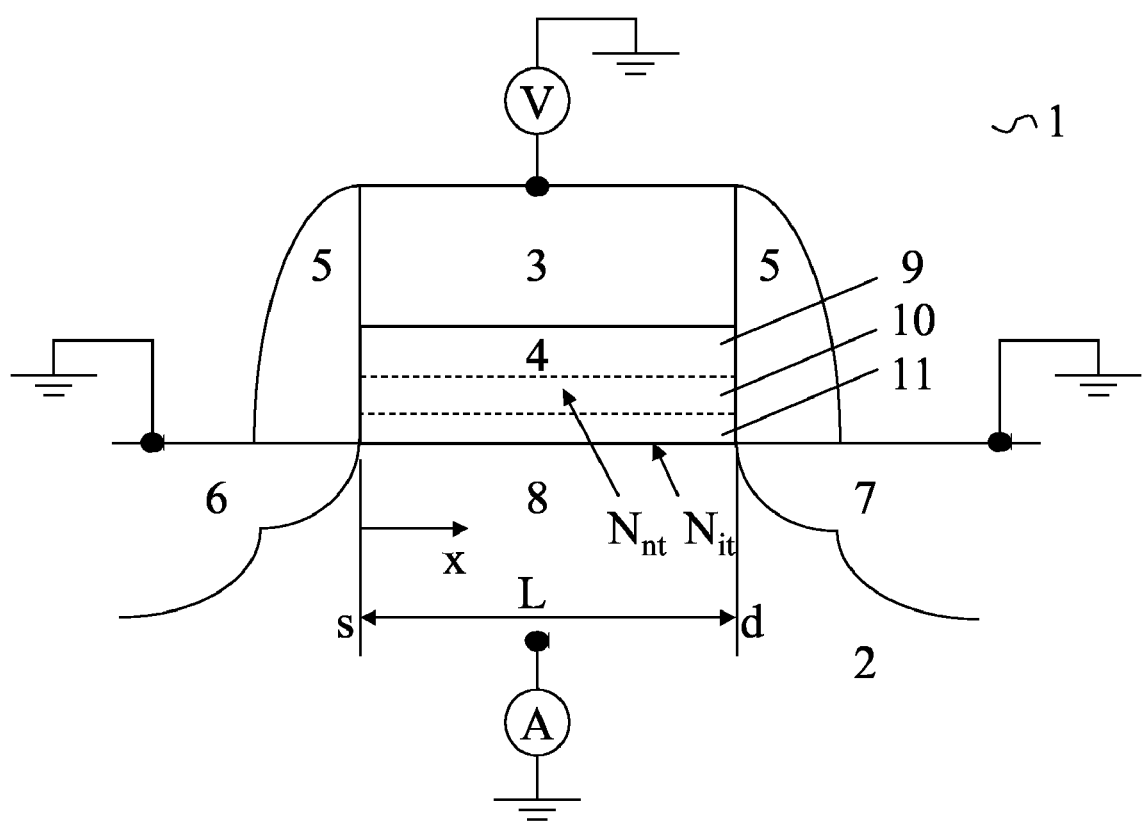
FIGS. 9a-e show (a) schematic cross-section of a measurement set-up for performing charge-pumping measurement of a charge-trapping semiconductor device, (b) a first pulse sequence and (c) the resulting charge-pump curve, (d) a second pulse sequence and (e) the resulting charge-pump curve.

A charge-pumping measurement set-up, which can be used in for determining the charge pumping curves, is schematically shown in FIG. 9a. Source (6), drain (7) and substrate (2) regions are biased to a fixed voltage, preferably 0V or ground. A voltage source, e.g. a pulse generator, is connected to the gate electrode while current is measured at the substrate. This measurement set-up is also known as amplitude-sweep charge-pumping set-up as the amplitude of the voltage pulses applied to the gate electrode is increased during the measurement.

In the embodiment described below, the measurement sequence comprises two steps: first two charge-pumping measurements are performed on a device used as reference and secondly similar charge-pumping measurements are performed on the device-under-test (DUT).

Figure 10:
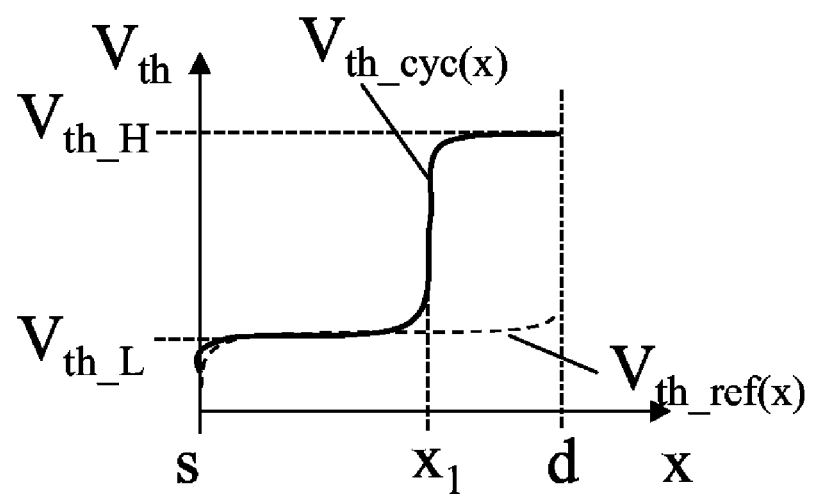
FIG. 10 shows the variation of the threshold voltage along the channel of a programmed charge-trapping semiconductor device.

The reference device is usually the same as the studied device but in a reference state. The studied device needs to have a monotonic increase or decrease of the threshold voltage along the channel, or at least along the part of the channel, which is subjected to the measurement method, typically half of the channel. In this case, each threshold voltage value corresponds to one point of the charge-pumping curve. The reference state of this device, more precisely the threshold voltage distribution thereof depends on the charge already trapped in the studied device. If the threshold voltage distribution in the studied device increases monotonically, it is better to have the reference state having a similar increase in threshold voltage distribution. For instance, the pristine device can be subjected to a light programming operation resulting in a monotonic increase of the charge in the charge-trapping layer which results in a threshold profile $V_{th}(x)$ that monotonic varies along the channel as shown in FIG. 10 by the dotted line $V_{th\_ref}(x)$. In this figure the threshold voltage of the device in the reference state slightly increase near the drain d. The number and distribution of the interface traps should remain essentially unaffected and essentially uniform over the channel. If the threshold voltage distribution monotonically decreases, it is better to have the reference state with also a decreasing threshold voltage distribution. The most natural reference state is in this case the virgin device, where the threshold voltage progressively decreases from the centre of the channel to the junction.

Figure 9B:
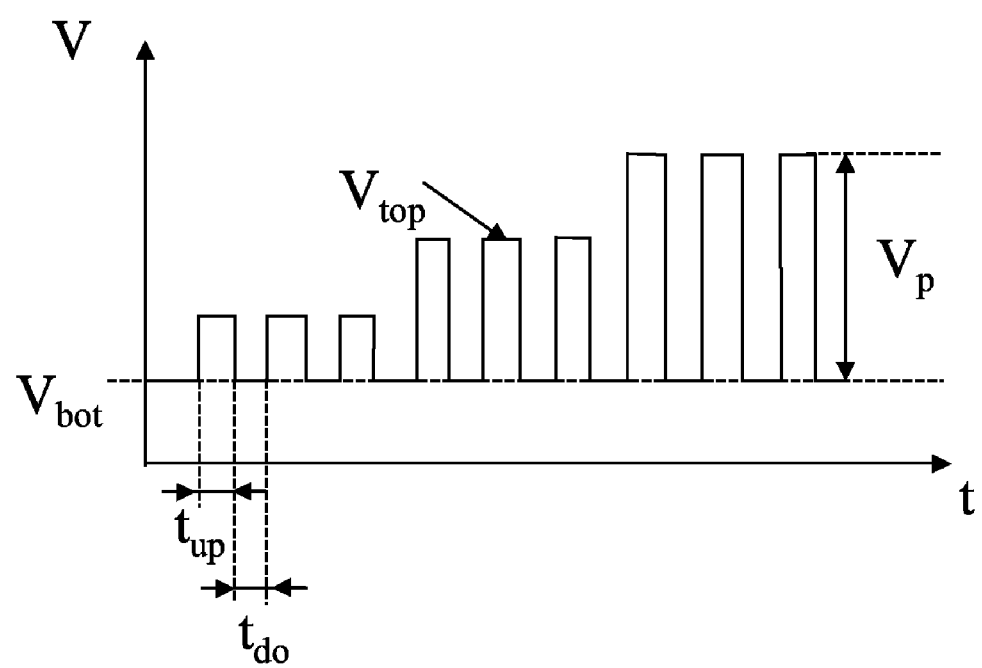
Figure 9C:
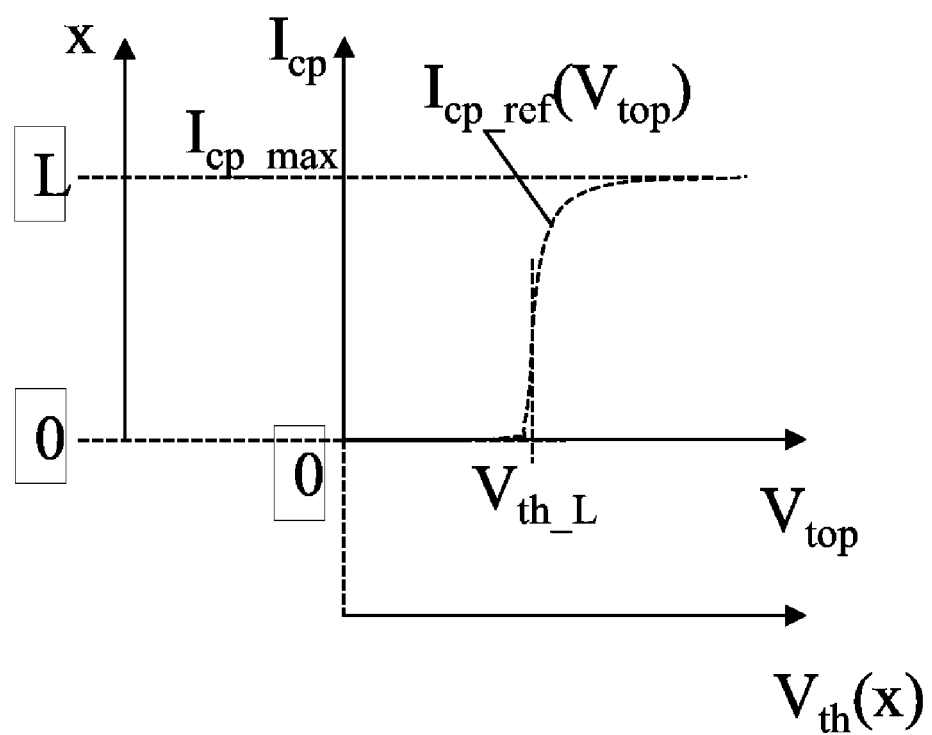

A first charge-pumping measurement, illustrated by FIGS. 9b and 9c, is performed on the device in the reference state that has not yet been electrically stressed, i.e. the interface trap distribution can be considered uniform along the channel. A first pulse train is applied to the gate electrode (3), whereby each pulse in this pulse train has the same bottom-level $V_{bot}$. The amplitude $V_p$ of the pulses increases monotonically with time by increasing the top-level $V_{top}$ of the pulses. The exemplary pulse train shown in FIG. 9b comprises 9 pulses grouped in sets of 3. The pulses in the first set have the lowest amplitude, the pulses in the second set have a higher amplitude, while the pulses in the last set have the highest amplitude. So the amplitude of the pulse in the pulse sequence or the voltage swing of each pulse increases progressively. The number of pulses in the pulse train, their duty cycle, the amplitude of each pulse, the way the amplitude $V_p$ is increased over the pulse train, e.g. stepwise, gradually, and the upper level $V_{top}$ are parameters of choice and can be selected in view of the required accuracy and measurement resolution.

When the bottom level of the pulse $V_{bot}$ is below the flatband voltage $V_{fb\_H}$ of the device (1) and the upper level of the pulse $V_{top}$ is above the threshold voltage $V_{th\_L}$ of the device (1) accumulation and inversion layers will be successively formed at the interface between the channel (8) and the gate dielectric (4). Inversion layer electrons from the source (6) and/or drain (7) regions will fill the interface states $N_{it}$ during the high pulse bias. These interface states thus become negatively charged. When the voltage is dropped below the flatband voltage $V_{fb\_ref}(x)$, accumulation layer holes from the substrate (2) will quickly recombine with the trapped electrons resulting in a charge-pump current $I_{cp}$. The charge-pump current is proportional to the pulse frequency and the number of interface states $N_{it}$ in the inversion region formed in the channel. From this charge-pumping measurement the charge-pump curve $I_{cp}(V_p)$ of this device in the reference state is obtained as shown in FIG. 9c given the current $I_{cp}$ or charge per pulse as function of the top level $V_{top}$ of the pulse train. One can change the vertical axis of this curve by replacing $I_{cp}$ with the position x along the channel: no current corresponds to one end of the channel, e.g. source where x=0, while the maximum $I_{cp\_max}$ current corresponds to the other end of the channel, e.g. drain where x=100%=channel effective length $L_{eff}$. By rearranging this charge-pumping curve by using the method disclosed by Maarten Rosmeulen et al in paragraph 3.3 of "Characterization of the spatial charge distribution in local charge-trapping memory devices using the charge-pumping technique", Solid-State Electronics journal, volume 48 (2004) p 1525-1530, hereby incorporated by reference, a threshold profile curve $V_{th,ref}(x)$ is obtained showing the change of voltage applied to this device as function of its relative position x with respect to source and drain.

Figure 9D:
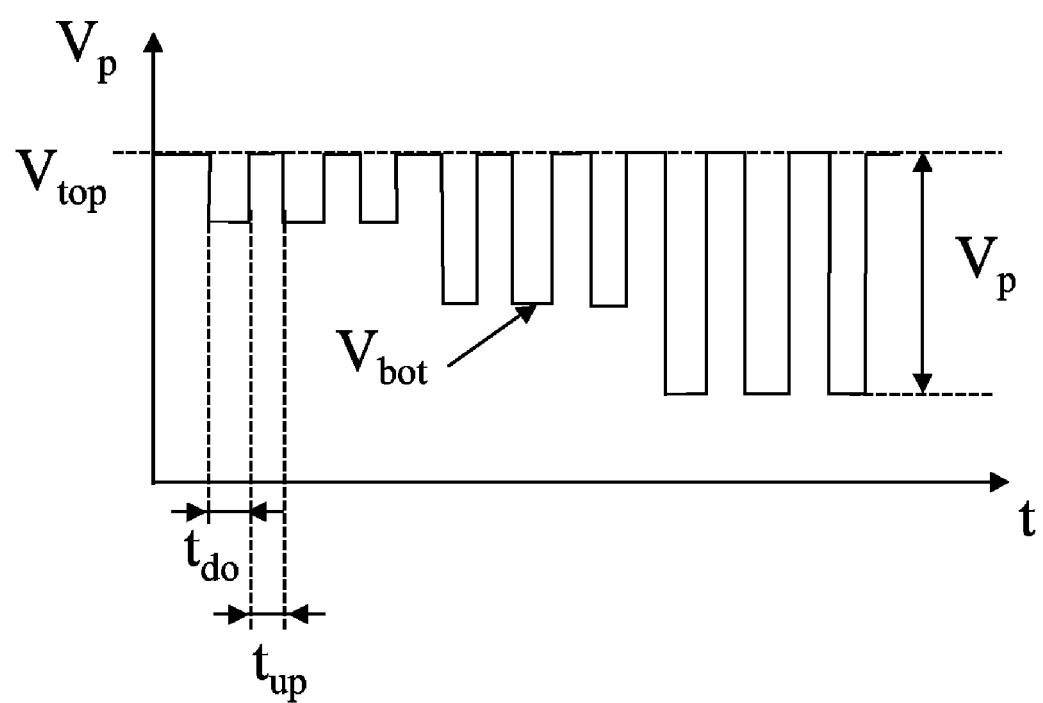
Figure 9E:
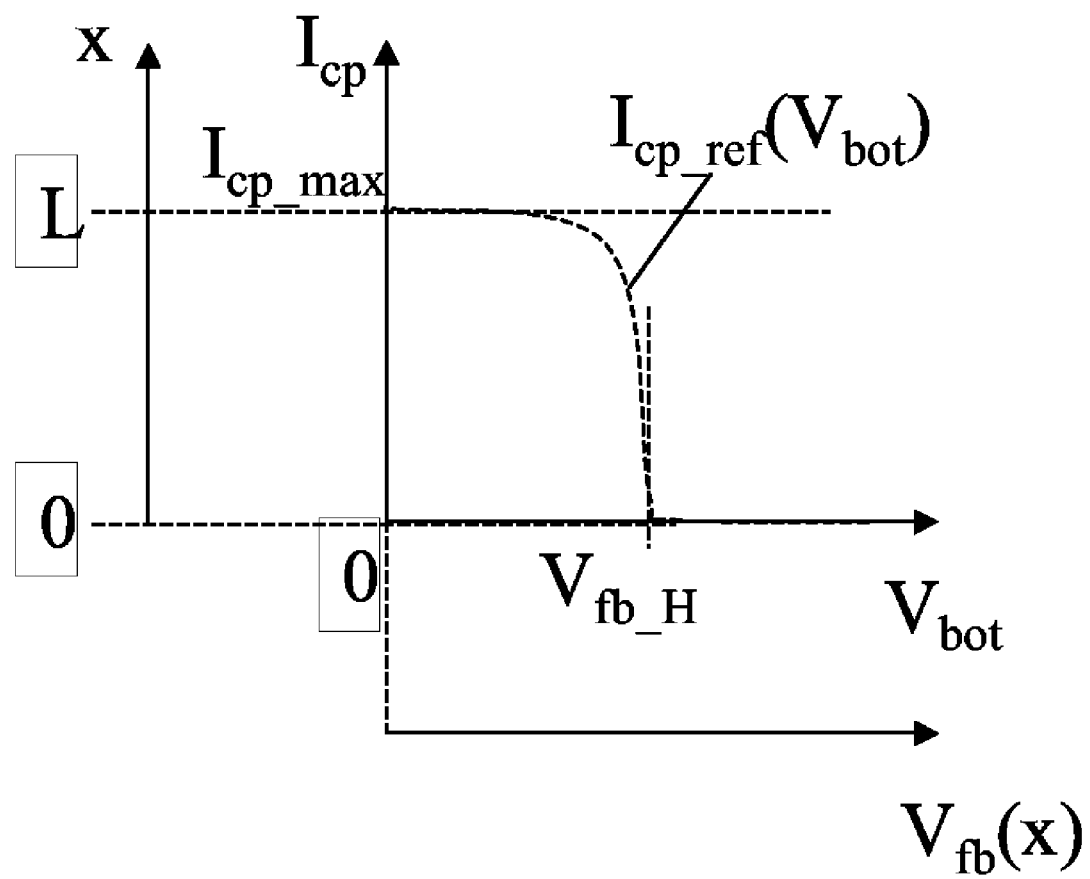

A second charge-pumping measurement is performed on the device in the reference state. A pulse train is applied to the gate electrode (3), whereby each pulse in this pulse train has the same top-level $V_{top}$. The amplitude $V_p$ of the pulses increases monotonically with time by lowering the bottom-level $V_{bot}$ of the pulses. The exemplary pulse train shown in FIG. 9d comprises 9 pulses grouped in sets of 3. The pulses in the first set have the lowest amplitude or voltage swing, the pulses in the second set have a higher amplitude, while the pulses in the last set have the highest amplitude. The number of pulses in the pulse train, their duty cycle, the amplitude of each pulse, the way the amplitude $V_p$ is increased over the pulse train, e.g. stepwise, gradually, the upper level $V_{top}$ are parameters of choice and can be selected in view of the required accuracy and measurement resolution. This pulse train with fixed top-level $V_{top}$ and varying bottom-level $V_{bot}$ will fill the interface states with electrons during the uptime $t_{up}$ of the pulse and with holes during the downtime $t_{do}$ of the pulse when $V_{bot}$ is below the flatband voltage $V_{fb\_H}$. As long as the lower level $V_{bot}$ of the pulse is above the flatband voltage $V_{fb\_H}$, the channel will remain in inversion and the interface traps are always filled with electrons. The channel (8) will switch between inversion and accumulation depending on whether the lower level $V_{bot}$ of the progressively increased pulse amplitude is above or below this flatband voltage $V_{fb\_H}$ and the interface traps will be alternatively filled with electrons and holes during the charge-pumping measurements. From this charge-pumping measurement the charge-pump curve $I_{cp}(V_p)$ of this device in the reference state is obtained as shown in FIG. 9e given the current $I_{cp}$ or charge per pulse as function of the bottom level $V_{bot}$ of the pulse train. One can change the vertical axis of this curve by replacing Iop with the position x along the channel: the maximum $I_{cp\_max}$ current corresponds to one end of the channel, e.g. source where x=0, while no current corresponds to the other end of the channel, e.g. drain where x=100%=channel effective length $L_{eff}$. By rearranging this charge-pumping curve by using the method disclosed by Maarten Rosmeulen et al in paragraph 3.3 of "Characterization of the spatial charge distribution in local charge-trapping memory devices using the charge-pumping technique", in Solid-State Electronics journal, volume 48 (2004) p 1525-1530, hereby incorporated by reference, a flatband profile curve $V_{fb,ref}(x)$ is obtained showing the change of voltage applied to this device as function of its relative position x with respect to source and drain.

A device under test is electrically stressed resulting in charged carriers to be injected into the charge-trapping layer (10). These injected carriers can be positively or negatively charged. On this device charge-pumping measurements according to the present invention are performed to determine the contribution to the threshold voltage of the charge $Q_{nt}$ stored in the charge-trapping layer (10) and the charge $Q_{it}$ generated by the interface traps $N_{it}$. The charge $Q_{nt}$ stored in the charge-trapping layer (10) generates a constant offset of the threshold voltage $\Delta V_{th\_Qnt}$, while the offset $\Delta V_{th\_Qit}$ generated by the charge stored in the interface traps depends on whether positive or negative charge is stored in these interface traps and on the number of interface traps $N_{it}$. In inversion the interface traps are filled with electrons causing an upward shift of the threshold voltage, while in accumulation the interface traps are filled with holes causing a downward shift of the threshold voltage. The degradation of a device, e.g. by repetitive electrical stress applied to the device, will change the number of interface traps and hence the threshold voltage offset $\Delta V_{th\_Qit}$. A threshold voltage distribution shown in FIG. 10 can result from negative charge e.g. present in the charge-trapping layer (10) of an nMOS device. A similar figure can be drawn for the flatband voltage distribution of this device. If the device of FIG. 1 is used as non-volatile memory cell, electrons can be injected into this layer (10) during the step of programming the memory cell, e.g. by channel-hot-electron-injection as is known in the art. Holes can be injected during the step of erasing the memory cell, e.g. by band-to-band tunneling induced hot hole injection as is known in the art. This localized trapped charge, e.g. in the region between $x_1$-d, will result in a local increase $V_{th\_ref}(x)-V_{th\_cyc}(x)$ of the threshold voltage and of the flatband voltage $V_{fb\_ref}(x)-V_{fb\_cyc}(x)$. For the purpose of teaching the invention it assumed that negative charge $Q_{nt}$ is stored in the charge-trapping layer (10) of an nMOS memory cell (1) resulting in positive shift of the threshold voltage and the flatband voltage, i.e. the threshold voltage and flatband voltage become more positive in these locations where the negative charge $Q_{nt}$ is stored. In real devices the threshold voltage distribution along the channel is not sharply define as suggested in FIG. 10 but will vary along the channel due to the presence of the junctions and of amongst other the interface traps $N_{it}$ which are distributed along the channel.

Figure 11A:
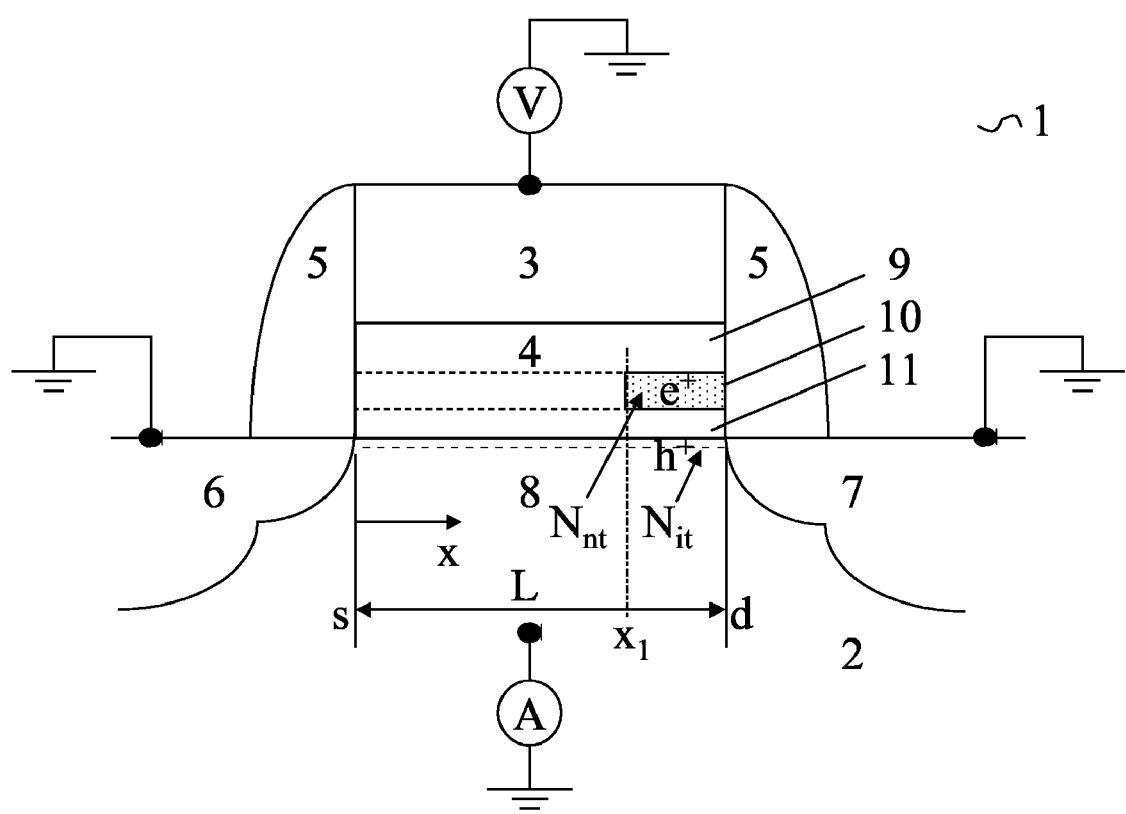
FIGS. 11a-c illustrate an extraction method by which the spatial charge distribution in the charge-trapping layer of the memory cell is preferably determined, upon determining a suitable set of programming conditions.
Figure 11B:
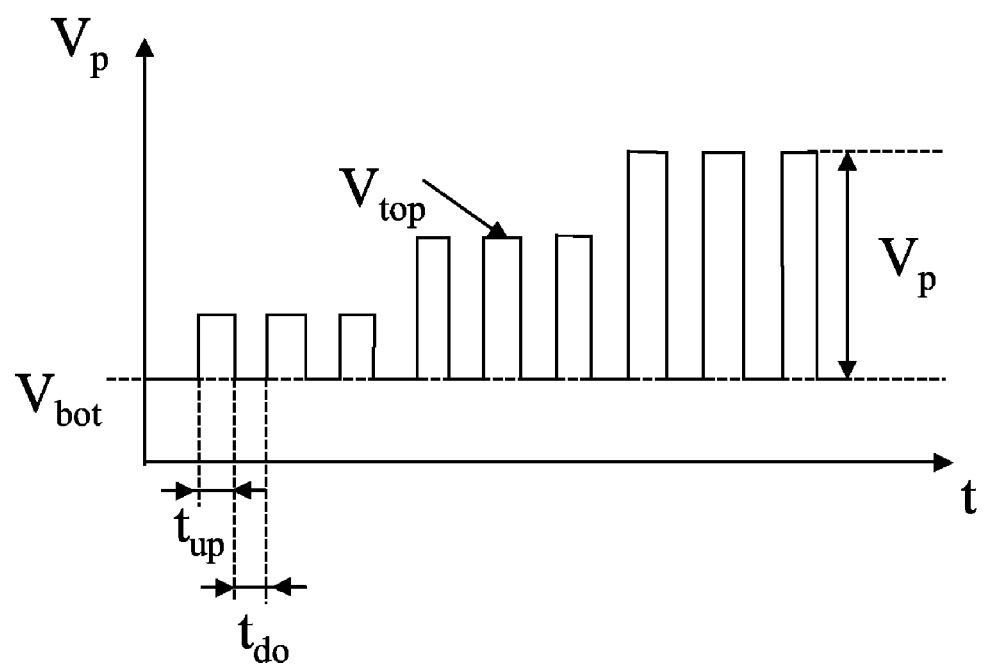
Figure 11C:
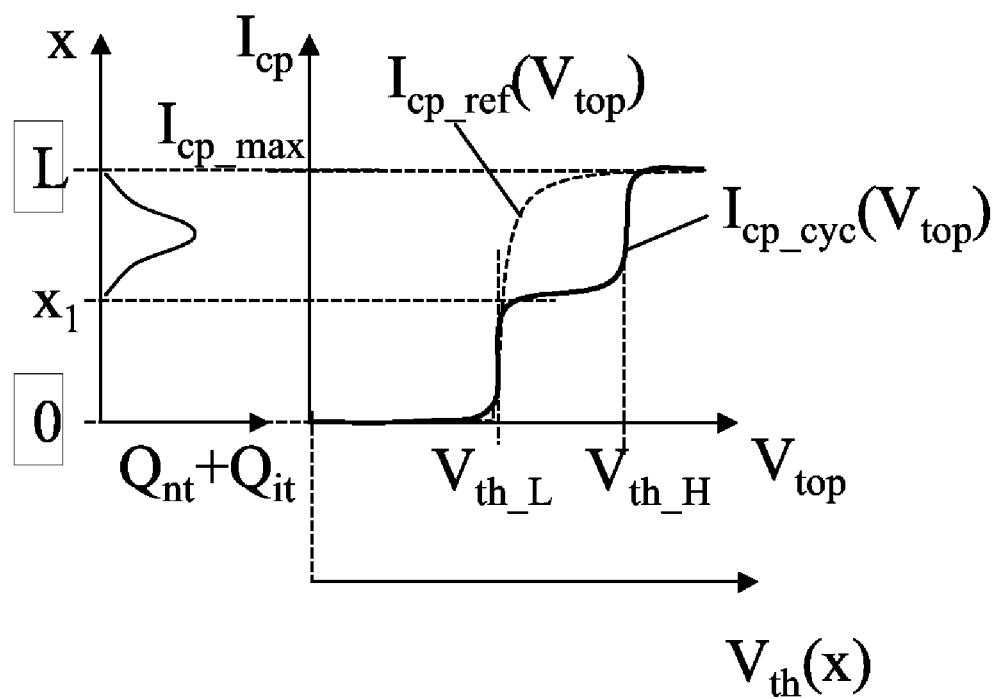

A first charge-pumping measurement is performed on the device under test. FIG. 11a illustrates such a device wherein a number $N_{nt}$ of negative charged particles (dotted area between position $x_1$ and drain d) is stored in the charge-trapping layer (10) resulting in an increase of the threshold voltage and flatband voltage in the portion $x_1$ to d compared to the portion s to $x_1$. A number of interface states $N_{it}$ are present (dots in the channel). A pulse train similar to the pulse train of the first measurement on the device in the reference state and illustrated by FIG. 11b is applied to this device also. As discussed in the first step when measuring the reference device, this pulse train with fixed bottom-level $V_{bot}$ and varying top-level $V_{top}$ will fill the interface states with electrons during the uptime $t_{up}$ of the pulse and with holes during the downtime $t_{do}$ of the pulse in these locations where the pulse is swept over the corresponding threshold voltage. If the number of interface states or the threshold voltage were uniform over the channel (8), one would obtain the same charge-pump current at each pulse independently of the amplitude of the pulse as long as $V_{top}$ is higher than the threshold voltage $V_{th}$. If however the threshold voltage is not constant over the channel, as shown in FIG. 10, with increasing pulse amplitude $V_p$ an increasing portion of the channel will contribute to the charge pump current. As long as the upper level $V_{top}$ of the pulse is lower than the local threshold voltage $V_{th\_H}$ the portion of the channel between $x_1$ and d will not contribute to the charge-pumping current. Until then the portion of channel (8) having the higher threshold voltage $V_{th\_H}$ will remain in accumulation and the corresponding interface traps will be always filled with holes as shown in FIG. 11a by the symbol $h^+$. The portion of the channel (8) having the lower threshold voltage $V_{th\_L}$ will switch between inversion and accumulation depending on whether the upper level $V_{top}$ is above or below this lower threshold voltage and the corresponding interface traps will be alternatively filled with electrons and holes during the charge-pumping measurement. If the pulse sequence of FIG. 11b is applied to the device of FIG. 11a the channel is scanned from source to drain if the threshold voltage $V_{th}(x)$ increases monotonically from the source to the drain. If only half of the channel is degraded, $V_{th}(x)$ needs to be monotonic only on half of the channel. The same procedure as applied to the charge-pumping signal in the first step for extracting the threshold voltage profile $V_{th}(x)$ from the charge-pumping current for the device under test is applied to this stressed device as illustrated by FIG. 11c. A relationship between the threshold voltage profile $V_{th}(x)$ and the location x in the channel can be established by the fact that the increase of the charge-pump current $I_{cp}$ from one location $x_1$ in the channel to another location $x_2$ can be attributed to the number of interface traps $N_{it}$ present in the channel area between these location. This relationship is expressed as follows:

$$\int_{X_1}^{X_2} qfN_{it}(x)\,dx \approx I_{cp}(V_{th}(x_2)) - I_{cp}(V_{th}(X_1)) \quad [1]$$

with q the absolute value of the electron charge, f the frequency of the pulse. In this FIG. 11c the dotted line indicates the reference charge-pump curve while the solid line indicates the charge-pumping curve obtained on the stressed device. The deviation between both charge-pump curves and hence in the corresponding threshold voltages is induced by the total charge $(Q_{nt}+Q_{it})$ present, for each point x along the channel, as expressed in the following formula:

$$\Delta V_{th}(x) = V_{th\_ref}(x) - V_{th\_cyc}(x) \quad [2]$$
$$= \frac{\Delta Q_{nt}(x) - \Delta Q_{it}(x)}{2C}$$
$$= \frac{q\Delta N_{nt}(x) - q\Delta N_{it}(x)}{2C}$$

with C the capacitance of the dielectric stack (F/cm²), q the absolute value of the electron charge. The concentration of charge in the charge-storage layer $N_{nt}(x)$ (#/cm²) is positive if electrons are trapped, while the local concentration of interface traps $N_{it}(x)$ is also in (#/cm²). By varying the top level of the voltage applied on the gate as described in this paragraph classical charge-pumping curves are obtained as is known by a person skilled in the art. During this charge-pumping measurement the threshold voltage and flatband voltage at any given point is determined by the charge at that point: electrons stored in the charge-trapping layer (10) and the holes trapped in the interface states. The shift in threshold voltage is indicated in FIG. 11c.

Figure 12A:
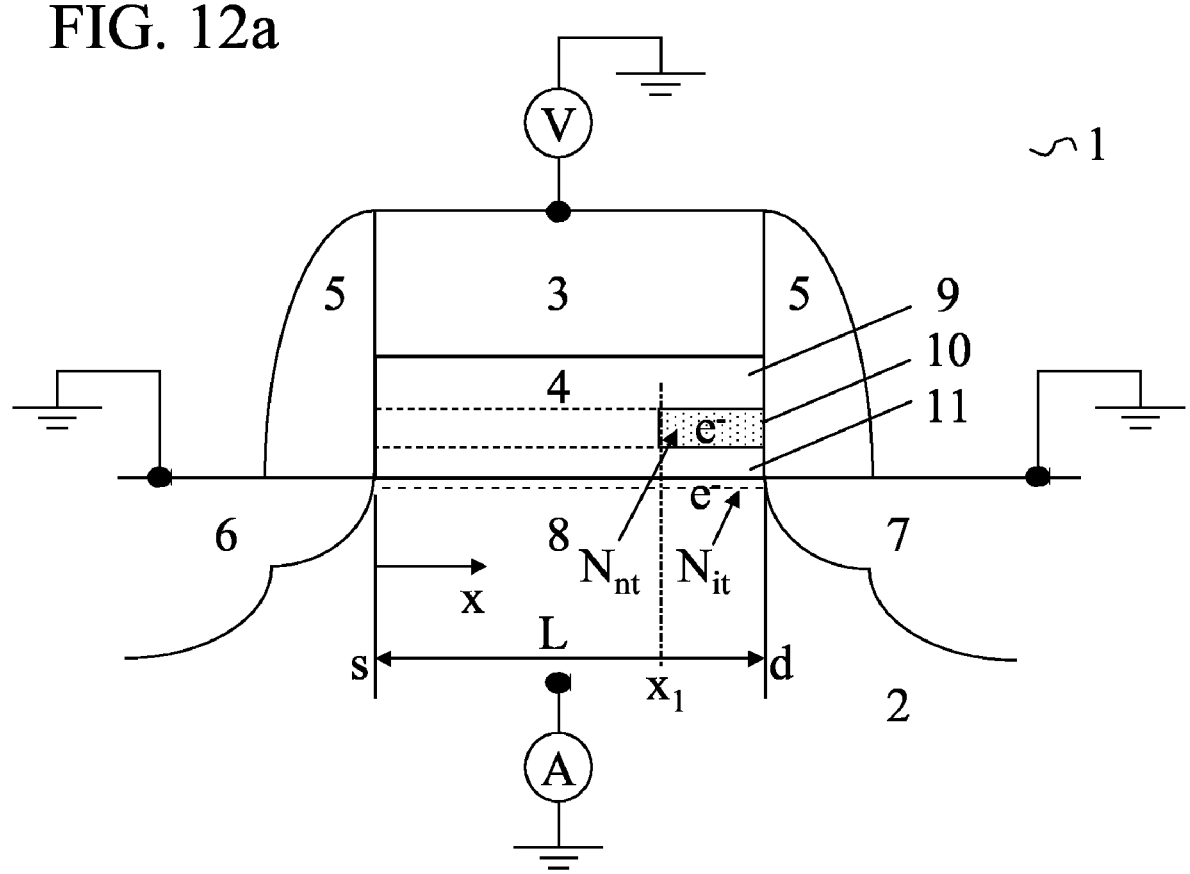
FIGS. 12a-c illustrate an extraction method by which the spatial charge distribution in the charge-trapping layer of the memory cell is preferably determined, upon determining a suitable set of programming conditions.
Figure 12B:
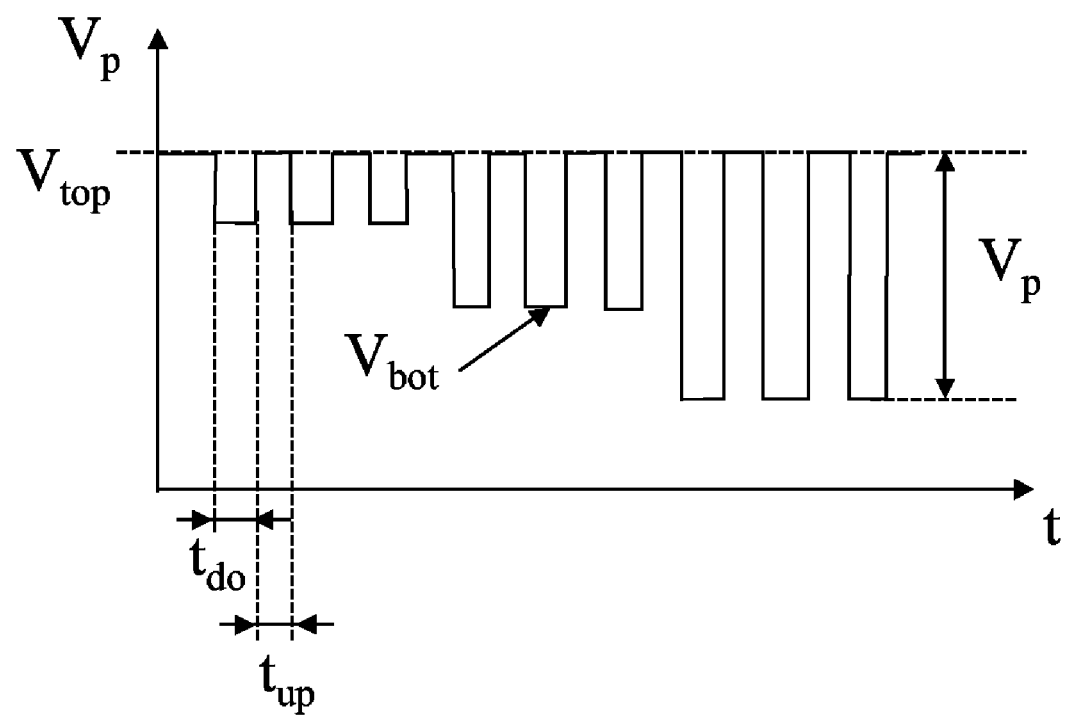
Figure 12C:
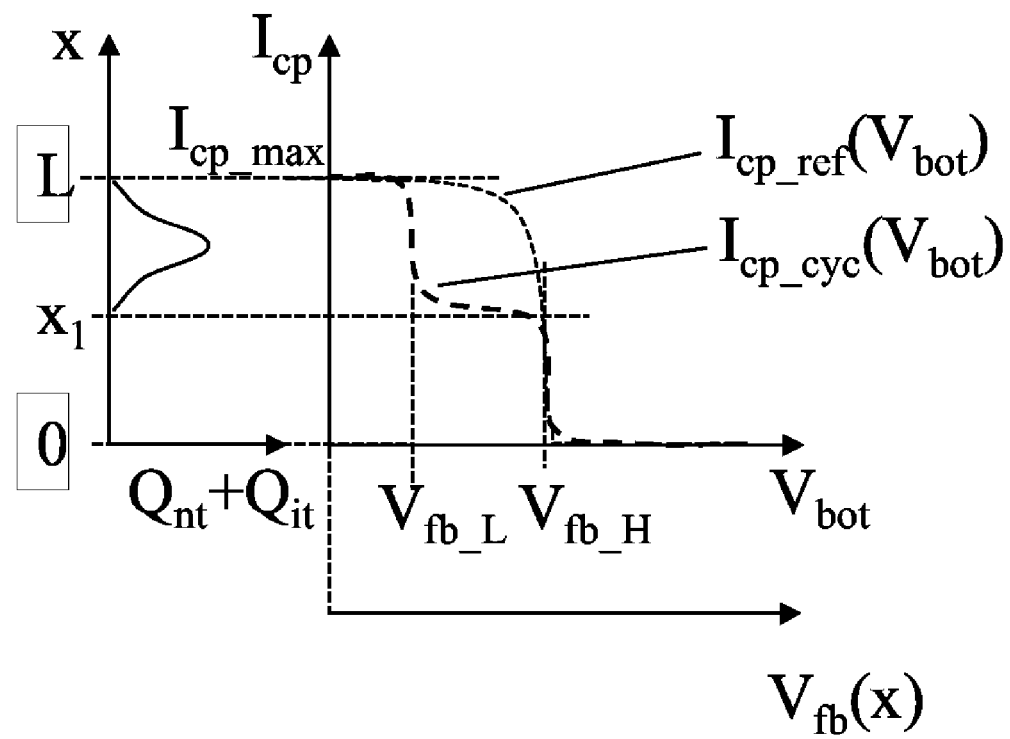

A second charge-pumping measurement is performed on this device under test. FIG. 12a illustrates such a device wherein a number $N_{nt}$ of negative charged particles (dotted area between position $x_1$ and drain d) is stored in the charge-trapping layer (10). A number of interface states Nit are present (dots in the channel). A pulse train, similar to the pulse train applied during the second measurement on the device in the reference state, is applied to the gate electrode (3), whereby each pulse in this pulse train has the same top-level $V_{top}$. The amplitude $V_p$ of the pulses increases monotonically with time by lowering the bottom-level $V_{bot}$ of the pulses. The exemplary pulse train shown in FIG. 12b comprises 9 pulses grouped in sets of 3. The pulses in the first set have the lowest amplitude or voltage swing, the pulses in the second set have a higher amplitude, while the pulses in the last set have the highest amplitude. The number of pulses in the pulse train, their duty cycle, the amplitude of each pulse, the way the amplitude $V_p$ is increased over the pulse train, e.g. stepwise, gradually, the upper level $V_{top}$ are parameters of choice and can be selected in view of the required accuracy and measurement resolution. This pulse train with fixed top-level $V_{top}$ and varying bottom-level $V_{bot}$ will fill the interface states with electrons during the uptime $t_{up}$ of the pulse and with holes during the downtime $t_{do}$ of the pulse in these locations where the pulse is swept over the corresponding flatband voltage. As long as the lower level $V_{bot}$ of the pulse is above the local flatband voltage $V_{fb\_L}$ the portion of the channel between $x_1$ and d will remain in inversion and the interface traps are always filled with electrons as shown in FIG. 12a by the symbol e−. This portion of the channel (8) having the lower flatband voltage $V_{fb\_L}$ will switch between inversion and accumulation depending on whether the lower level $V_{bot}$ of the progressively increased pulse amplitude is above or below this lower flatband voltage and the corresponding interface traps in this region will be alternatively filled with electrons and holes during the charge-pumping measurements. If the pulse sequence of FIG. 12b is applied to the device of FIG. 12a the channel is scanned from drain to source if the flatband voltage $V_{fb}(x)$ increases monotonically from the source to the drain. The same procedure as applied to the charge-pumping signal in the first step for extracting the flatband voltage $V_{fb}(x)$ profile from the charge-pumping current for the device under test is applied to this stressed device as illustrated by FIG. 12c. A relationship between the flatband voltage profile $V_{fb}(x)$ and the location x in the channel can be established by the fact that the increase of the charge-pump current $I_{cp}$ from one location $x_1$ in the channel to another location $x_2$ can be attributed to the number of interface traps $N_{it}$ present in the channel area between these location. This relationship is expressed as follows:

$$\int_{x_1}^{x_2} q f N_{it}(x) \, dx \approx I_{cp}(V_{fb}(x_2)) - I_{cp}(V_{fb}(X_1)) \quad [3]$$

with q the absolute value of the electron charge, f the frequency of the pulse. In this FIG. 12 the dotted line indicates the charge-pump curve of the reference device, while the heavy dotted line indicates the charge-pump curve obtained on the stressed device. The deviation between both charge-pump curves and hence in the corresponding flatband voltages is induced by the total charge $(Q_{nt}+Q_{it})$ present, for each point x along the channel, as expressed in the following formula:

$$\Delta V_{fb}(x) = V_{fb\_ref}(x) - V_{fb\_cyc}(x) \quad [4]$$
$$= \frac{\Delta Q_{nt}(x) + \Delta Q_{it}(x)}{2C}$$
$$= \frac{q\Delta N_{nt}(x) + q\Delta N_{it}(x)}{2C}$$

with C the capacitance of the dielectric stack (4) (F/cm$^2$) and q the absolute value of the electron charge. The concentration of charge in the charge-storage layer $N_{nt}(x)$ (#/cm$^2$) is positive if electrons are trapped, while the local concentration of interface traps $N_{it}(x)$ is also in (#/cm$^2$). By varying the bottom level of the voltage pulses applied on the gate as described in this paragraph the charge-pumping curves of FIG. 12c are obtained. During this charge-pumping measurement the threshold voltage and flatband voltage at any given point is determined by the charge at that point: electrons stored in the charge-trapping layer (10) and the electrons trapped in the interface states.

Figure 13:
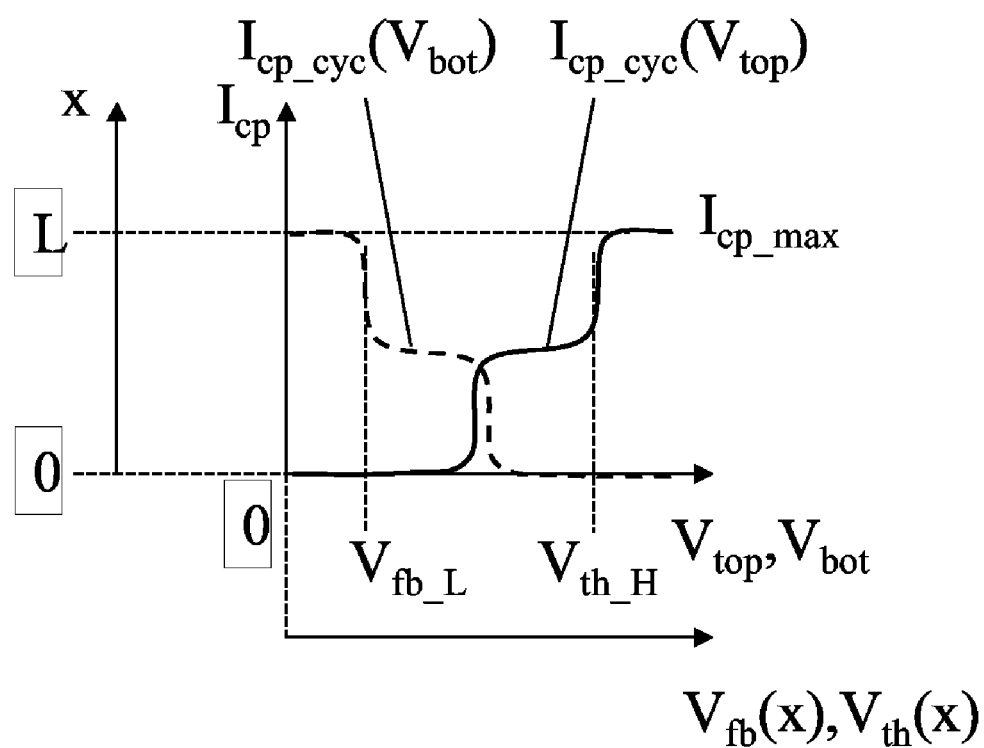
FIG. 13 illustrates an extraction method by which the spatial charge distribution in the charge-trapping layer of the memory cell is preferably determined, upon determining a suitable set of programming conditions.

The charge-pumping curves obtained on the stressed device are compared with the charge-pumping curve of the reference device or unstressed device. The deviation between the reference curves on the one hand and the corresponding stressed curves is due to the overall threshold or flatband voltage variation caused by the charge in the charge-trapping layer (10) and in the interface states. The difference between the two deviations is due to the charge in the interface states only. FIG. 13 combines the two charge-pump curves obtained on the stressed device. In both cases the maximum current measured $I_{cp\_max}$ is substantially the same, such that for any location x in the channel, the following relationship holds:

$$I_{cp}(x)(\text{varying top level}) + I_{cp}(x)(\text{varying bottom level}) = I_{cp\_max} \quad [5]$$

Figure 14:
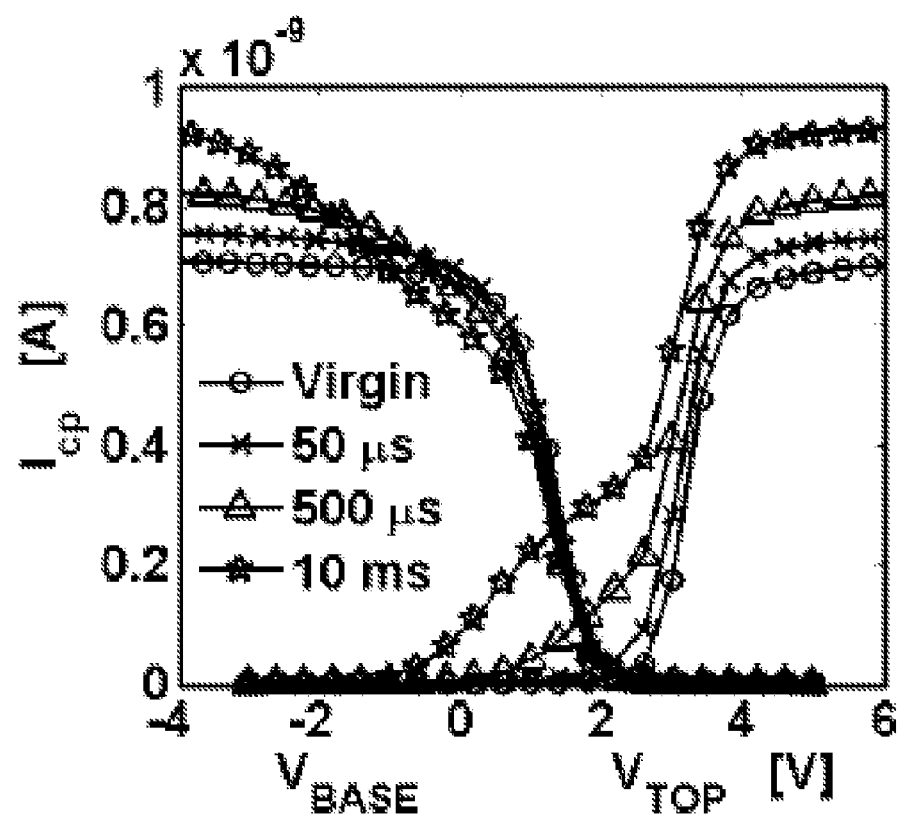
FIG. 14 shows charge-pumping curves for varying top-level or bottom-level.

The correlation between the two measurements on the stressed device depends on $I_{cp\_max}$, which makes the results of the extraction very sensitive to this value. Theoretically, the charge-pumping curves saturate completely if the top level of the pulse is high enough (or if the base level of the pulse is low enough, following the type of measurement). The measurements in FIG. 14 show that the saturation is in reality not perfect, curves slightly continue to increase for high voltages. This causes incertitude on $I_{cp\_max}$. The best choice of $I_{cp\_max}$ is explained later in this text.

Using the data from the charge-pumping measurements with respectively varying top and bottom level performed on the device in the reference state (FIG. 9c, 9e) and on the cycled device (FIG. 11c, 12c) and the above equations ([1], [2], [3], [4], [5]) one can determining the contribution of the charge in the charge-trapping layer (10) and of the charge in the interface states to the change in threshold voltage.

Equations [2] and [4] can be combined to yield the following formula:

$$(V_{th\_ref}(x) - V_{fb\_ref}(x)) - (V_{th\_cyc}(x) - V_{fb\_cyc}(x)) = \frac{q\Delta N_{it}(x)}{C} \quad [6]$$

Equation [1] can be written as:

$$\int_{x_{i-1}}^{x_i} q f N_{it}(x) \, dx \approx ((N_{it}(x_i) - N_{it}(x_{i-1}))\left(\frac{x_i - x_{i-1}}{2}\right) \quad [7]$$
$$\approx I_{cp}(V_{th\_cyc}(x_i)) - I_{cp}(V_{th\_cyc}(x_{i-1}))$$

By solving successively equations [6] and [7] from a starting point $x_o$ to a final point $x_{end}$ one can find the position $x_i$ from equation [7] which corresponds to the interface states $N_{it}(x_i)$ from equation [6]. The profile of charge in the charge-trapping layer can be found by either solving equation [2] or [4].

The method allows an easy way to check the precision of the extracted profiles. Indeed, the last calculated position $x_{end}$ must correspond to the effective length of the channel:

$$x_{end} = L_{eff} \quad [8]$$

As explained before, the results are very sensitive to $I_{cp\_max}$. $I_{cp\_max}$ is then chosen such as equation [8] is verified. The use of $I_{cp\_max}$ as a variable and the addition of the equation [8] allow a higher accuracy on the extracted profiles. This is made possible by the new direct method to solve the equations [5-7].

In the following paragraph the extraction procedure is discussed in more detail. If the difference $(V_{th\_ref}(x) - V_{fb\_ref}(x))$ in equation [6] is constant, because the number of interface traps $N_{it,ref}$ of the device in the reference state is constant and equal to the ratio $(I_{cp\_max}/L_{eff})$, this difference is given by combining the threshold voltage profile and flatband voltage profile given by respectively FIGS. 9c and 9e. For the device in the reference state, equation [5] allows to determine for a selected threshold voltage $V_{th\_cyc}$ the corresponding flatband voltage $V_{fb\_cyc}$, as the sum of the corresponding charge-pump currents must be equal to the maximum charge-pump current $I_{cp\_max}$. The starting point $x_o$ is selected such that the threshold voltage $V_{th\_cyc}(x_o)$ is not shifted and the number of interface states $N_{it}(x_o)$ is equal to the number of interface states in the device in the reference state $N_{it,ref}=(I_{cp\_max}/L_{eff})$. By directly solving equations [6] and [7] successively for all measurement points in the charge-pump curve from this starting point $x_i=x_o$ to $x_i=x_{end}$, one can find the position $x_i$ from equation [7] which corresponds to the interface states $N_{it}(x_i)$ from equation [6]. The profile of charge in the charge-trapping layer can be found by either solving equation [2] or [4].

If the difference $(V_{th\_ref}(x)-V_{fb\_ref}(x))$ in equation [6] is not constant, equations [6] and [7] cannot be solved directly. Both equations are then rewritten in the form "$N_{it}(x_i)=$" which can be solved numerically.

$$N_{it}(x_i) = N_{it,ref} + \frac{C}{q}[(V_{th\_ref}(x) - V_{fb\_ref}(x)) - (V_{th\_cyc}(x) - V_{fb\_cyc}(x))] \quad [9]$$

$$N_{it}(x_i) = \frac{2[I_{cp}(V_{th\_cyc}(x_i) - I_{cp}(V_{th\_cyc}(x_{i-1}))]}{x_i - x_{i-1}} - N_{it}(x_{i-1})$$

Hence the extraction technique according to the present invention allows determining the contribution of the charge in the charge-trapping layer (10) and of the charge in the interface states to the change in threshold voltage.

In FIG. 13 the two charge-pumping curves used in the extraction method of the previous embodiments are shown. Ideally the charge-pumping current $I_{cp}$ reaches a maximum charge-pumping current $I_{cp\_max}$ corresponding to a voltage bias $V_{top}$ or $V_{bot}$ wherein the complete area of the channel (8) having a known channel length $L_{eff}$ contributes to the charge-pumping current. For this well-defined maximum charge-pumping current $I_{cp\_max}$ one can reconstruct the spatial distribution of charge $N_{nt}$ stored in the charge-trapping layer (10) of a semiconductor device (1). However in real measurements the current measured when applying a varying base-level or top-level voltage pulse sequence might not reach a maximum value and will continue to vary with varying pulse voltage. When such charge-pumping curves are obtained one can determine the maximum charge-pumping current $I_{cp\_max}$, corresponding to the complete area of the channel (8) having a known channel length $L_{eff}$, from the effective charge-pumping curves in various ways some of which are described in the embodiments below.

In a preferred embodiment of the extraction method, the charge pumping curves are combined as follows. As described before, a relation between the charge pumping current $I_{cp}$ and the calculated channel length $L_{calc}$ of the semiconductor device is established. In this embodiment, this is done by selecting on one of the charge pumping curves at least two charge pumping currents $I_{cp}$ and determining the calculated channel length $L_{calc}$ corresponding to each of the charge pumping currents $I_{cp}$ by reconstructing the spatial charge distribution for each of the charge pumping currents $I_{cp}$. In this way, a set of at least two data points ($L_{calc}$, $I_{cp}$) is obtained. From this set of data points, the charge pumping current $I_{cp}$ having a channel length substantially equal to the effective length $L_{eff}$ i.e. the maximum charge pumping current $I_{cp\_max}$ can be obtained as follows.

For example, various existing numerical techniques can be used to determine from this set of at least two data points ($L_{calc}$, $I_{cp}$), the data point ($L_{calc}=L_{eff}$, $I_{cp}=I_{cp\_max}$). One can use known numerical analytical techniques such as linear interpolation or binary search to determine this data point ($L_{eff}$, $I_{cp\_max}$). A person skilled in the art will appreciate that the first values of the charge pump current $I_{cp}$ are selected from the upper current range of the measured charge-pumping curve as such selection will speed up the extraction process.

As an alternative, an analytical function $L_{calc}(I_{cp})-L_{eff}=0$ can be determined from the set of at least two data points ($L_{calc}$, $I_{cp}$), and by solving this analytical function the charge pumping current $I_{cp}$ having a channel length substantially equal to the effective length $L_{eff}$, i.e. the maximum charge pumping current $I_{cp\_max}$, can be determined. Then, the spatial distribution $N_{nt}$ of the charge is extracted by reconstructing the spatial charge distribution from the charge pumping curves using the value of $I_{cp}=I_{cp\_max}$. A person skilled in the art will appreciate that the first values of the charge pump current $I_{cp}$ are selected from the upper current range of the measured charge-pumping curve as such selection will speed up the extraction process.

Another alternative could be to combine the data from the charge pumping curves as follows. Again a relation between the charge pumping current $I_{cp}$ and a calculated channel length $L_{calc}$ of the semiconductor device is established by selecting on one of the charge pumping curves a value of the charge pumping current $I_{cp}$ and determining the calculated channel length $L_{calc}$ corresponding to this charge pumping current $I_{cp}$ by reconstructing the spatial charge distribution for this charge pumping current $I_{cp}$. In this embodiment however, the calculated channel length $L_{calc}$ is compared with the effective length $L_{eff}$ and in case of a mismatch, a new value for the charge pumping current $I_{cp}$ is determined using the information given by the mismatch, i.e. the selection of the value for the charge pumping current $I_{cp}$ is optimised. This sequence of steps is repeated until the mismatch between the calculated channel length $L_{calc}$ and the effective length $L_{eff}$ is substantially zero, in which case the determined charge pumping current $I_{cp}$ corresponds to the maximum charge pumping current $I_{cp\_max}$. The spatial distribution $N_{nt}$ of the charge is then extracted by reconstructing the spatial charge distribution from the charge pumping curves using this value of $I_{cp}=I_{cp\_max}$. A person skilled in the art will appreciate that the first values of the charge pump current $I_{cp}$ are selected from the upper current range of the measured charge-pumping curve as such selection will speed up the extraction process.

In the above extraction methods the determined charge pumping current $I_{cp}$ is said to correspond to the maximum charge pumping current $I_{cp\_max}$, when the difference between the obtained calculated channel length $L_{calc}$ and the effective length $L_{eff}$ is less than 2%, preferably less than 1% of the effective channel length $L_{eff}$.

Although the extraction methods according to the present application are particular useful for extracting the spatial distribution of charge $N_{nt}$ stored in the charge-trapping layer (10) of a memory device (1), these extraction methods can be applied to any kind of semiconductor device (1) wherein a dielectric stack (4) is sandwiched between an electrode (3) and a semiconductor region (2). The disclosed extraction methods can be used to the extract charge stored in this dielectric stack (4). For example in a MOSFET, used as logic transistor, charge might be unintentionally incorporated in the gate dielectric (4). Typically this incorporated charge might result from the device operation, e.g. hot carriers, or result from the semiconductor manufacturing process introducing fixed or mobile charge in the gate dielectric. This gate dielectric can be of a single dielectric material such as silicon-oxide, silicon-oxy-nitride, a high-k dielectric such as alumina-oxide, hafnium-oxide, and hafnium-silicon-oxide as known in the art. Likewise this gate dielectric can be a stack of dielectric materials, e.g. a high-k dielectric formed upon a silicon-oxide. As is the case for the memory device in the previous embodiments, this charge $N_{nt}$ will also influence the threshold voltage profile $V_{th}(x)$ and flatband voltage profile $V_{fb}(x)$ of the logic transistor. Hence the disclosed extraction methods can also be applied to such logic transistor to determine the spatial distribution of the incorporated charge $N_{nt}$.

In the disclosed extraction methods the spatial charge distribution $N_{nt}$ is reconstructed from the charge pumping curves by combining data from these charge pumping curves to obtain the spatial distribution. This data from the charge pumping curves can be further combined to obtain a spatial distribution of charge ($N_{it}$) in traps present at the interface between the channel (8) and a dielectric stack (4). Hence the present extraction methods also allow determining the spatial distribution of this interface charge $N_{it}$, even when charge is present in the dielectric stack (4). The dependency of this interface charge on parameters of the semiconductor process or of device operation can thus more accurately be determined.

Figure 15:
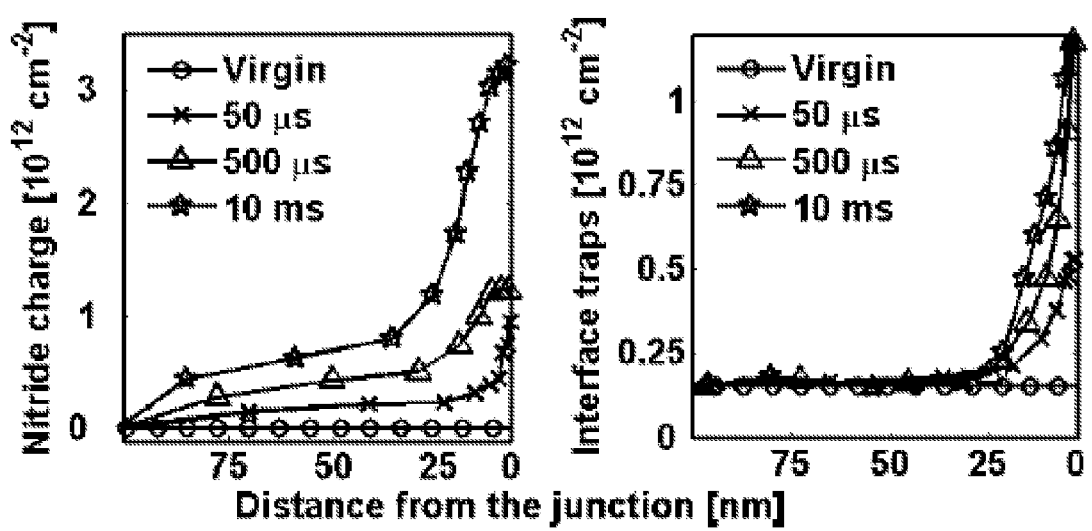
FIG. 15 shows the distribution profile of the charge in charge-trapping layer and in the interface traps.

FIGS. 14 to 15 illustrate a preferred embodiment of the invention.

FIG. 14 shows two sets of charge-pumping curves obtained using respectively the varying top-level and varying-base level pulse sequence described above. The rising curves are obtained using the fixed-bottom/varying top-level pulse sequence. The falling curves are obtained using the fixed-bottom/varying base-level pulse sequence. Each set contains a curve for a reference device, i.e. an unstressed nMOS device with an ONO layer as gate dielectric, and curves for the same nMOS devices (1) that were subjected to respectively 50 us, 500 us and 10 ms of hole injection. Nitride was used as charge-trapping layer. Holes where injected using typical state-of-the art voltage settings: grounding of source and bulk applying −5V to the gate and 5V to the drain. The longer the injection time the more positive charge is stored in the device and the larger the shift in the charge-pumping curve compared to the virgin device.

From these curves the distribution of the charge in the nitride layer ($N_{nt}$) and in the interface traps ($N_{it}$) for the respective devices can be extracted with the extraction technique of the invention. FIG. 15 shows the corresponding distribution curves. With progressive injection of holes the interface becomes more degraded.

Using the charge-pumping technique of the present invention allows extracting the distribution profile of the charge in the nitride layer whether electrons or holes are trapped in this nitride layer while, taking the degradation of the interface states into account.

Prior art charge-pumping measurement techniques can only extract the electron distribution in a charge-trapping layer (10), e.g. injected therein during the programming operation of a memory cell, by assuming that the interface traps do not affect the threshold voltage. In particular the additional interface traps created when injecting holes in the charge-trapping layer (10), e.g. when erasing a memory cell, makes the extraction of the charge distribution in the charge-trapping layer impossible using these prior art charge-pump techniques due to the sensitivity of the charge-pumping measurement to this interface degradation. By using two charge-pumping measurements with respectively varying top-level and bottom-level, the present invention however allows to extract the dielectric charge and interface traps such that the distribution profile of electrons or holes present in the dielectric layer can be obtained. The thus obtained distribution profiles are used for physical understanding and further optimization of charge-trapping devices. The extraction method allows extracting the distribution of the injected charge into the charge-trapping layer of the memory device and hence to determine voltage settings during injection for obtaining the desired charge profile to optimize the characteristics of the device. This extraction is more accurate as the degradation of the interface states is taken into account.

The invention claimed is:

1. A method for determining a set of programming conditions for a given type of a non-volatile memory device comprising a charge-trapping layer of multiple discrete charge storage sites isolated from each other in which charge is to be stored according to a desired spatial charge distribution, the device further comprising a channel region which extends underneath the charge-trapping layer in a bulk between two junction regions and a gate region which extends above the charge-trapping layer, the method comprising:
   a) selecting different sets of programming parameters to be applied to the junction regions, the bulk and the gate region of a corresponding number of non-volatile memory devices of said type,
   b) programming said number of non-volatile memory devices by means of the sets of programming parameters,
   c) determining an actual spatial charge distribution of the charge trapping layer of each of the devices programmed in step b),
   d) determining the influence of at least one of the programming parameters on the spatial charge distribution by comparison of the actual spatial charge distributions determined in step c) while taking into account the programming parameters selected in step a),
   e) determining an optimised value for at least one of the programming parameters in view of the desired spatial charge distribution, based on its influence determined in step d), and
   f) entering each optimised value determined in step e) in said sets of programming parameters and repeating steps b) to e) at least once.

2. A method according to claim 1, wherein the device is a dual-bit non-volatile memory device in which a bit is storable in the charge-trapping layer in the vicinity of each of the junction regions, the method further comprising the initial step of determining said desired spatial charge distribution in function of a reduced maximal screening voltage to be applied to either of the junction regions for screening off the respective bit.

3. A method according to claim 2, wherein the maximal screening voltage is selected below a value at which accidental storage of charge in the charge trapping layer of memory devices electrically connected to the memory device in read-out can occur.

4. A method according to claim 2, wherein the desired spatial charge distribution is determined by a method comprising:
   g) selecting the maximal screening voltage below a value at which accidental storage of charge in the charge trapping layer can occur,
   h) determining the width (Wb) of an extension region of one of the junction regions upon applying the maximal screening voltage to said junction region, and
   i) defining the desired spatial charge distribution such that, under the programming conditions to be determined, at least 90% of the charge stored in the vicinity of said junction region is within a distance (X1) smaller than or equal to said width (Wb) from said junction region.

5. A method according to claim 1, wherein the device is a dual-bit non-volatile memory device in which a bit is storable in the charge-trapping layer in the vicinity of each of the junction regions, the method further comprising the initial step of determining said desired spatial charge distribution in function of a reduced channel length of said channel region.

6. A method according to claim 5, wherein the desired spatial charge distribution is determined by a method comprising:
j) selecting the channel length,
k) defining a bit area for each bit in said charge-trapping layer and a margin in between said bit areas, and
l) defining the desired spatial charge distribution such that, under the programming conditions to be determined, at least 90% of the charge stored in the vicinity of either of said junction regions is within the respective bit area.

7. A method according to claim 6, wherein the channel length is selected below or equal to 90 nm and that said margin is set at 1 to 20% of said channel length.

8. A method according to claim 1, wherein the actual spatial charge distributions in step c) are determined according to a method comprising:
m) determining a varying base level voltage charge pumping curve,
n) determining a varying top level voltage charge pumping curve,
o) establishing a relation between a maximum charge pumping current $I_{cp}$, and a calculated channel length $L_{calc}$ of the semiconductor device by reconstructing a spatial charge distribution estimate from the charge pumping curves for multiple values of the charge pumping current $I_{cp}$,
p) selecting from the multiple values of $I_{cp}$, the value for which the corresponding calculated channel length $L_{calc}$ is substantially equal to the effective channel length $L_{eff}$ of the semiconductor device, and
q) reconstructing the spatial charge distribution from the charge pumping curves using the value of $I_{cp}$ obtained in step p).

9. A method for operating a dual-bit non-volatile memory device comprising a charge-trapping layer of multiple discrete charge storage sites isolated from each other, a channel region which extends underneath the charge-trapping layer in a bulk between two junction regions and a gate region which extends above the charge-trapping layer, a bit being storable in the charge-trapping layer in the vicinity of each of the junction regions, the method comprising:
r) programming one of said bits of the non-volatile memory device by applying predetermined programming conditions, such that carriers of a first charge type are injected into the charge-trapping layer, wherein the predetermined programming conditions are chosen such that the carriers are stored in the charge-trapping layer according to a desired spatial charge distribution which is determined in function of a reduced maximal screening voltage to be applied to either of the junction regions for screening off said one bit.

10. A method for operating a dual-bit non-volatile memory device according to claim 9, wherein said desired spatial charge distribution is determined by a method comprising:
g) selecting the maximal screening voltage below a value at which accidental storage of charge in the charge trapping layer can occur,
h) determining the width (Wb) of an extension region of one of the junction regions upon applying the maximal screening voltage to said junction region, and
i) defining the desired spatial charge distribution such that, under the programming conditions to be determined, at least 90% of the charge stored in the vicinity of said junction region is within a distance (X1) smaller than or equal to said width (Wb) from said junction region.

11. The method of claim 9, wherein the carriers of a first charge type are electrons and that the predetermined programming conditions are chosen such that secondary electron injection is suppressed.

12. The method of claim 9, wherein the carriers of a first charge type are holes and that the predetermined programming conditions are chosen such that secondary hole injection is suppressed.

13. The method of claim 11, wherein the secondary hole/electron injection is suppressed by means of a predetermined voltage difference between one of said junction regions and the bulk.

14. The method of claim 12, wherein the secondary hole/electron injection is suppressed by means of a predetermined voltage difference between one of said junction regions and the bulk.

15. A method for operating a dual-bit non-volatile memory device comprising a charge-trapping layer of multiple discrete charge storage sites isolated from each other, a channel region which extends underneath the charge-trapping layer in a bulk between two junction regions and a gate region which extends above the charge-trapping layer, a bit being storable in the charge-trapping layer in the vicinity of each of the junction regions, the method comprising:
s) programming one of said bits of the non-volatile memory device by applying predetermined programming conditions, such that carriers of a first charge type are injected into the charge-trapping layer, wherein the predetermined programming conditions are chosen such that the carriers are stored in the charge-trapping layer according to a desired spatial charge distribution which is determined in function of a reduced channel length of said channel.

16. A method for operating a dual-bit non-volatile memory device according to claim 15, wherein the desired spatial charge distribution is determined by a method comprising:
j) selecting the channel length,
k) defining a bit area for each bit in said charge-trapping layer and a margin in between said bit areas, and
l) defining the desired spatial charge distribution such that, under the programming conditions to be determined, at least 90% of the charge stored in the vicinity of either of said junction regions is within the respective bit area.

17. The method of claim 16, wherein the channel length is selected below or equal to 90 nm and that said margin is set at 1 to 20% of said channel length.

18. The method of claim 15, wherein the carriers of a first charge type are electrons and that the predetermined programming conditions are chosen such that secondary electron injection is suppressed.

19. The method of claim 15, wherein the carriers of a first charge type are holes and that the predetermined programming conditions are chosen such that secondary hole injection is suppressed.

20. The method of claim 18, wherein the secondary hole/electron injection is suppressed by means of a predetermined voltage difference between one of said junction regions and the bulk.

21. The method of claim 19, wherein the secondary hole/electron injection is suppressed by means of a predetermined voltage difference between one of said junction regions and the bulk.

* * * * *